US012007690B2

(12) United States Patent
Kaltenbach et al.

(10) Patent No.: US 12,007,690 B2
(45) Date of Patent: *Jun. 11, 2024

(54) FLEXOGRAPHIC PRINTING WITH REPEATING TILE OF RANDOMNLY-POSITIONED FEATURE SHAPES

(71) Applicant: Eastman Kodak Company, Rochester, NY (US)

(72) Inventors: Thomas F. Kaltenbach, Webster, NY (US); Kam Chuen Ng, Rochester, NY (US); James S. Honan, Spencerport, NY (US); Kevin Edward Spaulding, Spencerport, NY (US)

(73) Assignee: EASTMAN KODAK COMPANY, Rochester, NY (US)

( * ) Notice: Subject to any disclaimer, the term of this patent is extended or adjusted under 35 U.S.C. 154(b) by 371 days.

This patent is subject to a terminal disclaimer.

(21) Appl. No.: 17/341,651

(22) Filed: Jun. 8, 2021

(65) Prior Publication Data
US 2021/0397095 A1 Dec. 23, 2021

Related U.S. Application Data

(60) Provisional application No. 63/041,171, filed on Jun. 19, 2020.

(51) Int. Cl.
G03F 7/20 (2006.01)
B41C 1/05 (2006.01)

(52) U.S. Cl.
CPC .............. *G03F 7/2012* (2013.01); *B41C 1/05* (2013.01)

(58) Field of Classification Search
CPC ........................................................ G03F 7/20
See application file for complete search history.

(56) References Cited

U.S. PATENT DOCUMENTS 6,063,546 A  5/2000  Gelbart
6,213,018 B1  4/2001  Samworth
(Continued)

FOREIGN PATENT DOCUMENTS

JP  2016-147249  8/2016
JP  2016-224727  12/2016
(Continued)

OTHER PUBLICATIONS

Kodak "Effective Ink Transfer" (Year: 2023).*
(Continued)

*Primary Examiner* — Chanceity N Robinson
(74) *Attorney, Agent, or Firm* — David A. Novais

(57) ABSTRACT

A method for fabricating a flexographic printing plate for printing image patterns including one or more uniform image regions includes defining a repeating tile having a pattern of feature shapes positioned at pseudo-random feature locations. A plate formation pattern corresponding to the image pattern is determined wherein the repeating tile is applied in a tiled arrangement to the uniform image regions. The plate formation pattern is used to form a flexographic printing plate, wherein regions of the flexographic printing plate corresponding to the uniform image regions of the image pattern include a pattern of raised features in positions corresponding to the feature positions in the repeating tile.

23 Claims, 20 Drawing Sheets

(56) References Cited

U.S. PATENT DOCUMENTS

| | | | |
|---|---|---|---|
| 6,684,772 | B2 | 2/2004 | Harte |
| 6,731,405 | B2 | 4/2004 | Samworth |
| 7,511,855 | B2 | 3/2009 | Butterfield et al. |
| 8,399,177 | B2 * | 3/2013 | Stolt .................. G03F 7/202 430/5 |
| 9,235,126 | B1 | 1/2016 | Bielak |
| 9,315,062 | B2 | 4/2016 | Zwadlo |
| 9,375,910 | B2 | 6/2016 | Bielak |
| 9,789,680 | B2 | 10/2017 | Frakenberg et al. |
| 10,150,319 | B1 | 12/2018 | Bielak |
| 10,265,943 | B2 | 4/2019 | Kuramoto et al. |
| 10,272,710 | B2 | 4/2019 | Sato et al. |
| 10,334,739 | B1 | 6/2019 | Honan et al. |
| 2008/0233280 | A1 | 9/2008 | Blanchet et al. |
| 2014/0327452 | A1 | 11/2014 | Petcavich et al. |
| 2016/0221379 | A1 | 8/2016 | Namba et al. |
| 2017/0157966 | A1 * | 6/2017 | Becker .................. B41F 5/24 |

FOREIGN PATENT DOCUMENTS

| | | |
|---|---|---|
| JP | 2017-045262 | 3/2017 |
| JP | 2017-045612 | 3/2017 |
| WO | 2016/129270 | 8/2016 |

OTHER PUBLICATIONS

"Kodak DigiCap NX Patterning" whitepaper, https://www.kodak.com/uploadedfiles/digicapnx_whitepaper.pdf.

"Kodak Flexcel NX System: Conquering Edge Definition" whitepaper, (https://www.kodak.com/uploadedFiles/Graphics/About_Us/Blogs/2018/Conquering-Edge-Definition-article.pdf.

"Kodak Flexcel NX System: Effective Ink Transfer" whitepaper, https://www.kodak.com/uploadedFiles/Miraclon/Flexographic/FLEXCEL-NX-Effective-Ink-Transfer-whitepaper.pdf.

"Kodak Flexcel NX System: Getting the whites right," whitepaper, https://www.kodak.com/uploadedFiles/Graphics/About_Us/Blogs/2018/Getting-the-whites-right-Flexel-NX-system-white-paper.pdf.

"Kodak flexo plates: more than 6 reasons to choose them," https://www.flexo24.com/media/media/flexo24.com-Kodak-flexo-plates-more-than-6-reasons-to-choose-them.pdf.

"Kodak DigiCap NX Patterning-Application Recommendations," Kodak Customer Bulletin, Oct. 24, 2014.

Furukawa et al., "OLED Lighting Devices Fabricated by Flexography Printing of Silver Nanowire and Conducting Polymer," SID Symposium Digest of Technical Papers, vol. 46 (2015).

K. E. Spaulding et al., "Methods for generating blue-noise dither matrices for digital halftoning," J. Electron. Imaging, vol. 6, pp. 208-230 (1997).

K. E. Spaulding et al., "Adaptive error diffusion algorithm incorporating a visual model," J. Electron. Imaging, vol. 7, pp. 655-663 (1998).

* cited by examiner

FLEXOGRAPHIC PRINTING WITH REPEATING TILE OF RANDOMNLY-POSITIONED FEATURE SHAPES

CROSS-REFERENCE TO RELATED APPLICATIONS

This application claims the benefit of U.S. Provisional Patent Application No. 63/041,171, filed Jun. 19, 2020, which is incorporated herein by reference in its entirety.

Reference is made to commonly assigned, U.S. Patent Application Ser. No. 63/041,179, entitled "Flexographic printing with repeating tile including different randomly-positioned feature shapes," by Kaltenbach et al.; and to commonly assigned, U.S. Patent Application Ser. No. 63/041,185, entitled "Flexographic printing plate including pseudo-random pattern of raised features," by Kaltenbach et al., each of which is incorporated herein by reference.

FIELD OF THE INVENTION

This invention pertains to the field of flexographic printing and more particularly to a method for fabricating a flexographic printing plate for printing functional device patterns.

BACKGROUND OF THE INVENTION

Processing a web of media in roll-to-roll fashion can be an advantageous and a low-cost manufacturing approach for devices or other objects formed on the web of media. An example of a process that includes web transport through an additive printing system is roll-to-roll flexographic printing.

Flexography is a method of printing or pattern formation that is commonly used for high-volume printing runs. It is typically employed in a roll-to-roll format for printing on a variety of soft or easily deformed receiver materials including, but not limited to, paper, paperboard stock, corrugated board, polymeric films, fabrics, metal foils, glass, glass-coated materials, flexible glass materials and laminates of multiple materials. Coarse surfaces and stretchable polymeric films are also economically printed using flexography.

Flexographic printing plates are sometimes known as Flexographic printing members, relief printing members, relief-containing printing plates, printing sleeves, or printing cylinders, and are provided with raised relief images (i.e., patterns of raised features) onto which ink is applied for transfer to a substrate. While the raised relief images are inked, the recessed relief "floor" should remain free of ink.

Although flexographic printing has conventionally been used in the past for the printing of images, more recent uses of flexographic printing have included printing of functional devices, such as touch screen sensor films, antennas, and other devices to be used in electronics or other industries. Such devices typically include electrically conductive patterns but can also include patterns of other materials such as insulators or semiconductors, or un-patterned conductive or non-conductive regions that must be uniform and defect free.

Flexographic printing for the graphic arts generally involves printing images through combinations of dots which vary in size and spacing and concerns itself with visual image quality such as color reproduction and image sharpness. Occasionally there is a need in graphics printing to print "solids," meaning uniform image regions printed from a continuous relief feature rather than from large, densely packed dots. These regions can be difficult to print because they are susceptible to artifacts known as pinholes, trailing-edge voids, and viscous fingering, and the result is typically degraded image quality or image density. When printing "solids" for functional applications, these defects can interfere with continuity of the functional layer. In the case of an electrically conductive layer, it can reduce conductivity or completely disrupt it if the layer is subsequently patterned. In the case of non-electrically conductive layers containing such defects, short circuits can occur, or unwanted passage of contaminants can occur through the holes of the defect patterns.

When printing functional layers by flexography, the printing ink is a liquid that is cured in some fashion to yield a dry printed feature. Typically, the printing ink is applied to an anilox roller that has an engraved or etched cell pattern thereon that is used to present a predetermined volume of ink to the flexographic printing member. The flexographic printing member receives the ink from the anilox roller, typically about 50% of the ink on the anilox roll. The printing ink is then transferred from the flexographic printing member to the substrate, typically about 50% of the ink on the flexographic printing member.

Typically, anilox rollers are engraved with a regular pattern of cells having a predetermined number of cells per unit length which defines a cell size, a specified cell volume, and a predetermined cell shape and depth profile. These factors determine the capacity of the anilox roller to deliver a volume of ink that is conventionally measured and reported as the BCM Index (billions of cubic microns per square inch). Higher BCMI anilox rollers present a high volume of ink to the flexographic printing member. The shapes of the anilox cells are typically regular patterns of hexagons, diamonds, or from parallel lines. The parallel lines can be helical or sinusoidal.

In graphic arts flexography applications, the ink is typically printed from dots which have a size and shape that are substantially larger than the anilox cells. It is common to apply a regular pattern to the top of the dots on the flexographic printing member to improve print quality. Kodak enables the use of DigiCap NX Patterning and Advanced DigiCap NX Patterning as described in the white papers: "Kodak DigiCap NX Patterning," "KODAK FLEXCEL NX SYSTEM: Conquering Edge Definition," and "KODAK FLEXCEL NX SYSTEM: Effective Ink Transfer," and the Kodak Customer Bulletin entitled "Kodak DigiCap NX Patterning—Application Recommendations," dated Oct. 24, 2014. These publications describe the necessity of selecting a pattern that is correlated to the wet ink thickness as measured by increasing the BCMI.

Kodak DigiCap NX Patterning is covered by a number of patents including U.S. Pat. Nos. 8,399,177, 9,235,126 and 9,375,910 which describe methods for forming a flexographic plate that includes applying relief patterns to the raised features of the flexographic plate. U.S. Pat. Nos. 9,235,126 and 9,375,910 describe a variation that includes detecting an edge region of image features and an interior region of image features, applying fine pixel mask pattern to the edge regions, applying coarse pixel mask pattern to the interior regions; combining the fine patterned edge and the coarse patterned interior into a patterned image, and imaging the flexographic plate.

U.S. Pat. No. 8,399,177 to Stolt et al. describes the evaluation of a variety of arrangements of opaque features within image areas. The opaque coverage area was varied according to the size of the corresponding image area, the size of opaque features, and the positioning of opaque features was varied with randomized and regular patterns.

U.S. Pat. No. 6,063,546 to Gelbart teaches the use of a mask with varying optical density to control the amount of curing radiation delivered to individual plate precursor features. In particular, Gelbart teaches that relief feature accuracy can be improved by allowing a full exposure for highlight features, and gradually reducing exposure as tonality increases to some optimal level for full tone features. Gelbart teaches an analog method for varying optical density. For example, one or more layers of UV light-absorbing mask material can be removed to provide partial transparency for an image feature in a mask. Gelbart also teaches a digital method for varying optical density. For example, Gelbart teaches an area modulation technique involving a pseudo-random distribution of opaque features in an image area of a mask to effect an average reduction in exposure for the corresponding relief feature. Gelbart teaches that these opaque features should be small enough that upon exposure and developing they are not resolved in the relief plate (e.g. as relief holes).

U.S. Pat. No. 10,150,319 describes a method for forming flexographic printing plates wherein edge regions and interior regions of image features are identified, which are separated by gap regions. A fine texture pattern is applied to the edge regions and a coarse texture pattern is applied to the interior regions to form a textured image pattern which is used to form the flexographic plate. No texture pattern is applied to the gap regions thereby leaving gaps between the edge regions and the interior regions of the image features.

U.S. Pat. No. 6,731,405 discloses a printing plate having both solid and halftone areas including ink cells. The ink cells in the solid areas are provided according to a first pattern with a specified density and size of cells per unit area. In the halftone areas ink cells are superposed on selected numbers of halftone dots according to a second pattern with a density and size of cells that is a function of halftone dot size.

U.S. Pat. No. 7,511,855 describes a method for reducing edge effects, the method including inputting an image mask, the image mask defining the location of a boundary to receive a coating; modifying an edge of the image mask to reduce the thickness of the coating at the modified edge; creating a printing plate based on the modified image mask; and utilizing the printing plate to print the coating on a substrate.

U.S. Pat. No. 10,265,943 describes a flexographic printing plate having high ink transferability which enables printing with a high ink density in a solid region. The flexographic printing plate includes a relief layer with a non-image area and an image area having an uneven structure formed on a surface, in which the uneven structure is composed of recessed portions consisting of a plurality of grooves and projecting portions.

JP2016224727A describes a flexographic resin plate that has a coating region in which a plurality of recesses for accommodating the metal nanowire dispersion is formed in a lattice shape.

JP2017045612 describes a flexographic resin plate that has a coating region in which a recess for accommodating the metal nanowire dispersion is formed. The portions other than the recesses have a stripe shape, and each of the portions other than the recesses constituting the stripe shape is disposed along a direction at an angle of less than 30 degrees with respect to the rotation direction of the flexographic resin plate. In the coating step, the metal nanowire dispersion liquid is coated on the base material by both the concave portion and the portion other than the concave portion in the coating region of the flexographic resin plate.

In the article "OLED Lighting Devices Fabricated by Flexography Printing of Silver Nanowire and Conducting Polymer" (SID Symposium Digest of Technical Papers, Vol. 46, 2015), Furukawa et al. describe the printing of silver nanowires and conducting polymers with a print pattern having a solid pattern, where the effects of two types of surface shapes for the printing plate were examined using silver nanowire inks. One surface shape including a trench and another included a hole.

There remains a need for improved methods for printing uniform image regions in a function device pattern with a flexographic printing system that reduces the presence of defects such as trailing-edge voids, viscous fingering and pinholes.

SUMMARY OF THE INVENTION

The present invention represents a method for fabricating a flexographic printing plate for printing image patterns, comprising:

receiving an image pattern including one or more uniform image regions;

determining a repeating tile for forming a pattern of raised features in regions of the flexographic printing plate corresponding to the uniform image regions of the image pattern, including defining a tile size for the repeating tile having an area of at least 100 square pixels;

defining a feature shape; and defining the repeating tile including a plurality of the feature shapes, wherein the feature shapes are positioned in a pattern of pseudo-random feature locations within the repeating tile, and wherein the feature shapes cover between 2-30% of the area of the repeating tile;

determining a plate formation pattern corresponding to the image pattern, wherein the repeating tile is applied in a tiled arrangement to the uniform image regions within the image pattern; and using the determined plate formation pattern to form the flexographic printing plate using a flexographic printing plate formation process, wherein the plate formation pattern is transferred to the flexographic printing plate such that regions of the flexographic printing plate corresponding to the uniform image regions of the image pattern include a pattern of raised features in positions corresponding to the feature locations in the repeating tile.

This invention has the advantage that reduced artifacts are produced in uniform image regions of the image patterns.

It has the additional advantage that objectionable interactions between the pattern of raised features and the periodic cell pattern of an anilox roller are reduced.

BRIEF DESCRIPTION OF THE DRAWINGS

It is to be understood that the attached drawings are for purposes of illustrating the concepts of the invention and may not be to scale. Identical reference numerals have been used, where possible, to designate identical features that are common to the figures.

DETAILED DESCRIPTION OF THE INVENTION

Figure 1:
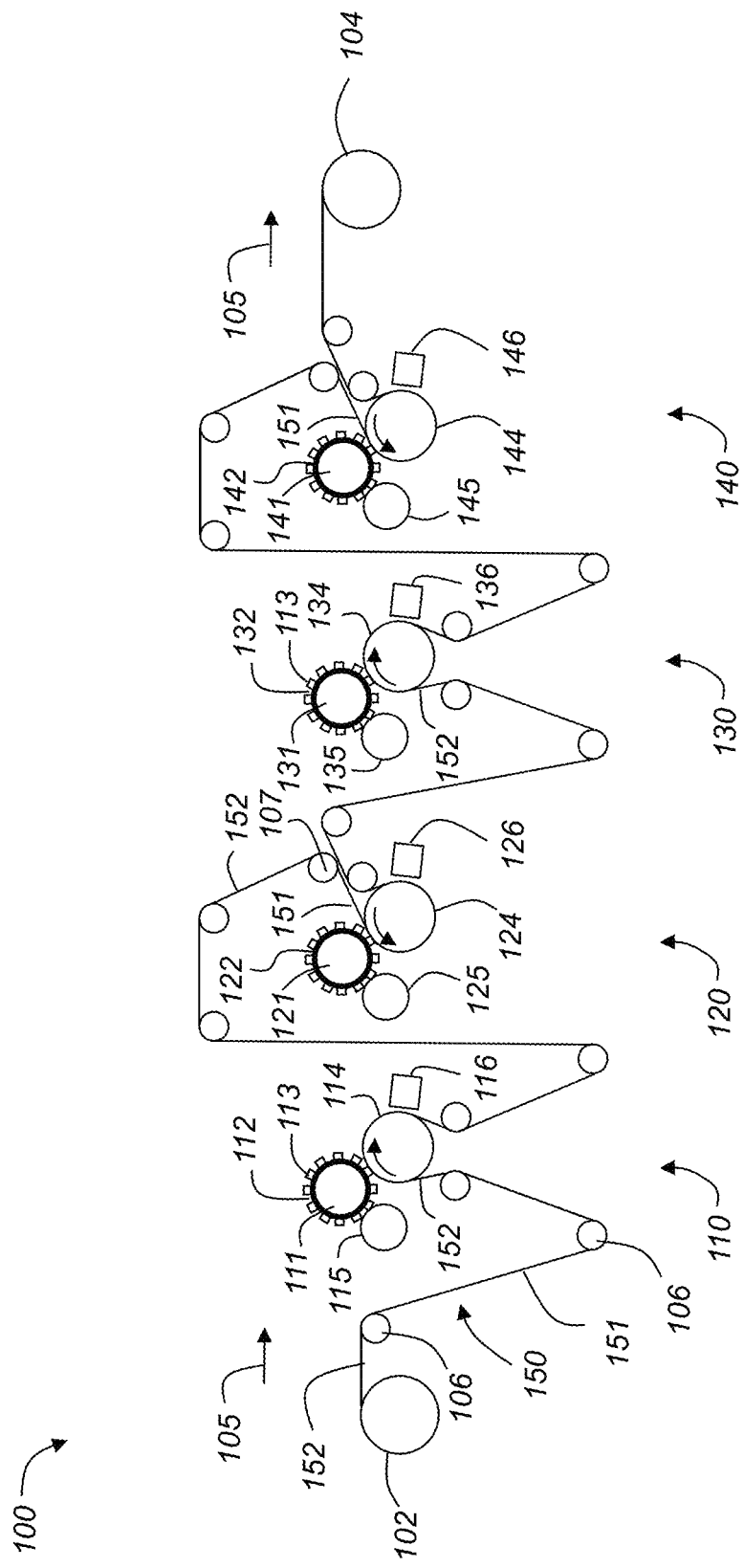
FIG. 1 is a schematic side view of a flexographic printing system for roll-to-roll printing on both sides of a substrate.

The present description will be directed in particular to elements forming part of, or cooperating more directly with, an apparatus in accordance with the present invention. It is to be understood that elements not specifically shown, labeled, or described can take various forms well known to those skilled in the art. In the following description and drawings, identical reference numerals have been used, where possible, to designate identical elements. It is to be understood that elements and components can be referred to in singular or plural form, as appropriate, without limiting the scope of the invention.

The invention is inclusive of combinations of the embodiments described herein. References to "a particular embodiment" and the like refer to features that are present in at least one embodiment of the invention. Separate references to "an embodiment" or "particular embodiments" or the like do not necessarily refer to the same embodiment or embodiments; however, such embodiments are not mutually exclusive, unless so indicated or as are readily apparent to one of skill in the art. It should be noted that, unless otherwise explicitly noted or required by context, the word "or" is used in this disclosure in a non-exclusive sense.

The example embodiments of the present invention are illustrated schematically and not to scale for the sake of clarity. One of ordinary skill in the art will be able to readily determine the specific size and interconnections of the elements of the example embodiments of the present invention.

References to upstream and downstream herein refer to direction of flow. Web media moves along a media path in a web advance direction from upstream to downstream. Similarly, fluids flow through a fluid line in a direction from upstream to downstream. In some instances a fluid can flow in an opposite direction from the web advance direction. For clarification herein, upstream and downstream are meant to refer to the web motion unless otherwise noted.

FIG. 1 is a schematic side view of a flexographic printing system 100 that can be used in some embodiments of the invention for roll-to-roll printing of a catalytic ink on both sides of a substrate 150 for subsequent electroless plating. Substrate 150 is fed as a web from supply roll 102 to take-up roll 104 through flexographic printing system 100. Substrate 150 has a first side 151 and a second side 152.

The flexographic printing system 100 includes two print modules 120 and 140 that are configured to print on the first side 151 of substrate 150, as well as two print modules 110 and 130 that are configured to print on the second side 152 of substrate 150. The web of substrate 150 travels overall in roll-to-roll direction 105 (left to right in the example of FIG. 1). However, various rollers 106 and 107 are used to locally change the direction of the web of substrate as needed for adjusting web tension, providing a buffer, and reversing the substrate 150 for printing on an opposite side. In particular, note that in print module 120 roller 107 serves to reverse the local direction of the web of substrate 150 so that it is moving substantially in a right-to-left direction.

Each of the print modules 110, 120, 130, 140 includes some similar components including a respective plate cylinder 111, 121, 131, 141, on which is mounted a respective flexographic printing plate 112, 122, 132, 142, respectively. Each flexographic printing plate 112, 122, 132, 142 has raised features 113 defining an image pattern to be printed on the substrate 150. Each print module 110, 120, 130, 140 also includes a respective impression cylinder 114, 124, 134, 144 that is configured to force a side of the substrate 150 into contact with the corresponding flexographic printing plate 112, 122, 132, 142. Impression cylinders 124 and 144 of print modules 120 and 140 (for printing on first side 151 of substrate 150) rotate counter-clockwise in the view shown in FIG. 1, while impression cylinders 114 and 134 of print modules 110 and 130 (for printing on second side 152 of substrate 150) rotate clockwise in this view.

Each print module 110, 120, 130, 140 also includes a respective anilox roller 115, 125, 135, 145 for providing ink to the corresponding flexographic printing plate 112, 122, 132, 142. As is well known in the printing industry, an anilox roller is a hard cylinder, usually constructed of a steel or aluminum core, having an outer surface containing millions of very fine dimples, known as cells. Anilox cells are typically formed as a periodic structure, using hexagonal or diamond patterns. Other periodic structures include, but are not limited to, helical, trihelical, and slalom patterns. Patterned anilox rollers can be obtained from various sources including Harper Corporation of America, Charlotte, NC or from Apex North America, Donora, PA Ink is provided to the anilox roller by a tray or chambered reservoir (not shown). In some embodiments, some or all of the print modules 110, 120, 130, 140 also include respective UV curing stations 116, 126, 136, 146 for curing the printed ink on substrate 150. Additional drying or curing devices may be employed, including infrared dryers, hot air dryers, and photonic curing devices.

In some embodiments of the invention, flexographic printing on rigid substrates can also be accomplished by moving the flexographic printing plate relative to the substrate, whether the flexographic printing plate is rolled over a stationary substrate, or the substrate is moved past a rotating flexographic printing plate.

Figure 2:
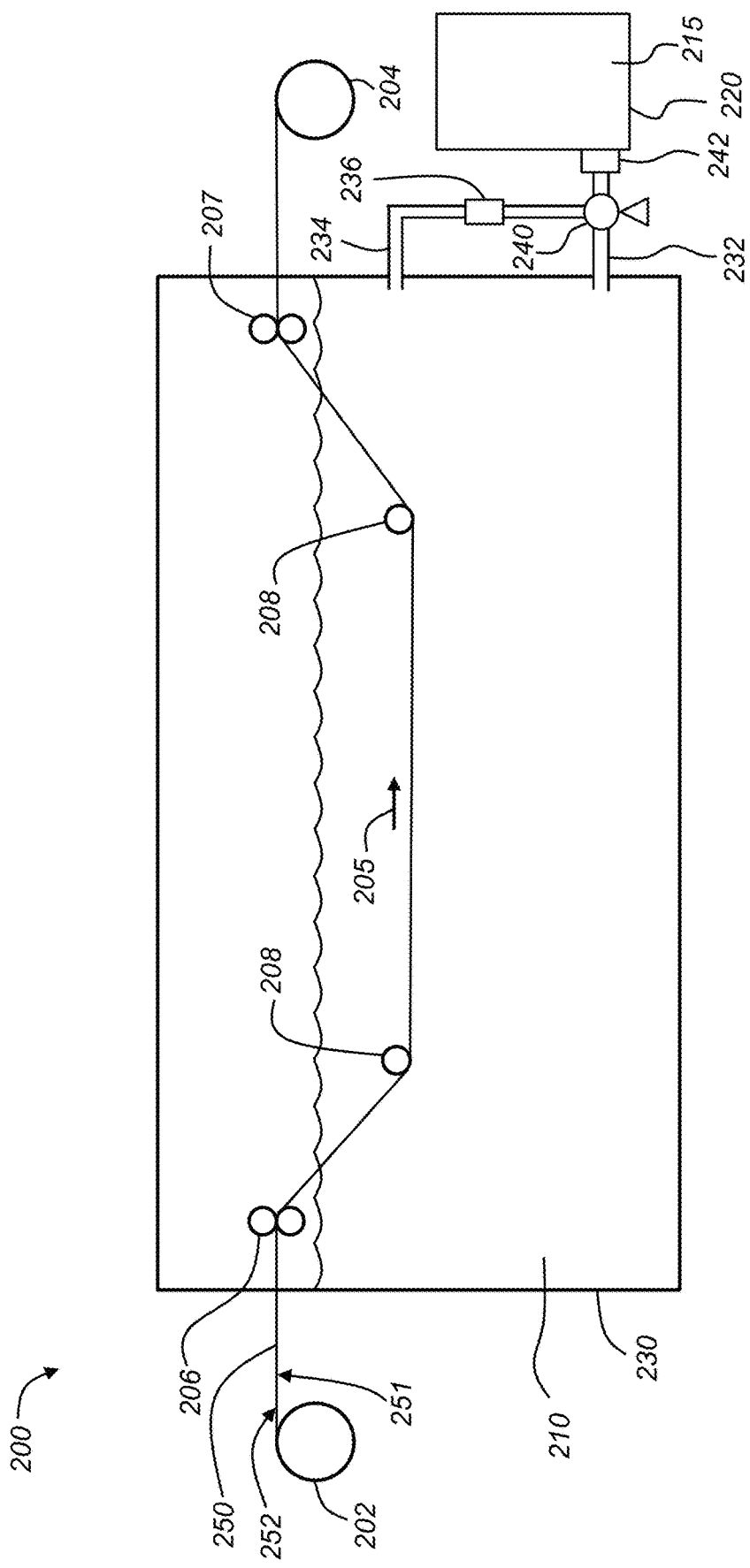
FIG. 2 is a schematic side view of a roll-to-roll electroless plating system.

FIG. 2 is a schematic side view of a roll-to-roll electroless plating system 200 disclosed in commonly-assigned, U.S. patent application Ser. No. 14/571,328 entitled "Roll-to-roll electroless plating system with liquid flow bearing," by S. Reuter et al., which is incorporated herein by reference. The roll-to-roll electroless plating system 200 includes a tank 230 of plating solution 210. Web of media 250 is fed by a web advance system along a web-transport path in an in-track direction 205 from a supply roll 202 to a take-up roll 204. The web of media 250 is a substrate upon which electroless plating is to be performed. Drive roller 206 is positioned upstream of the plating solution 210 and drive roller 207 is positioned downstream of the plating solution 210. Drive rollers 206 and 207 advance the web of media 250 from the supply roll 202 through the tank of plating solution 210 to the take-up roll 204. Web-guiding rollers 208 are at least partially submerged in the plating solution 210 in the tank 230 and guide the web of media 250 along the web-transport path in the in-track direction 205.

As the web of media 250 is advanced through the plating solution 210 in the tank 230, a metallic plating substance such as copper, silver, gold, nickel or palladium is electrolessly plated from the plating solution 210 onto predetermined locations on one or both of a first surface 251 and a second surface 252 of the web of media 250. As a result, the concentration of the metal or other components in the plating solution 210 in the tank 230 decreases and the plating solution 210 needs to be refreshed. To refresh the plating solution 210, it is recirculated by pump 240, and replenished plating solution 215 from a reservoir 220 is added under the control of controller 242, which can include a valve (not shown). In the example shown in FIG. 2, plating solution 210 is moved from tank 230 to pump 240 through a drainpipe 232 and is returned from pump 240 to tank 230 through a return pipe 234. In order to remove particulates from plating solution 210, a filter 236 can be included, typically downstream of the pump 240.

Particulates can be present in plating solution 210 due to contaminants that enter from outside of the tank 230, or can be generated from hardware within tank 230, or can result from spontaneous plating out of metal from the electroless plating solution 210. Particulates that settle on the bottom of the tank 230 are not a problem. However, particulates that fall onto the web of media 250 and become trapped between web of media 250 and one of the drive rollers 206, 207 or web-guiding rollers 208 can cause significant problems due to scratching of the delicate patterns formed on the web of media 250. In some cases, a particulate can become embedded in a roller and cause scratches in successive portions of the web of media 250 that contact it. In some embodiments, improved electroless plating systems can be used, such as those described in commonly-assigned U.S. Pat. No. 9,862,179, entitled "Web transport system including scavenger blade," by K. Hill et al.; commonly-assigned U.S. Pat. No. 9,771,655, entitled "Web transport system including fluid guide," by R. Bettin et al.; and commonly-assigned U.S. patent application Ser. No. 14/812,140, entitled "Electroless plating system including bubble guide" by R. Bettin et al., each of which is incorporated herein by reference.

Figure 3:
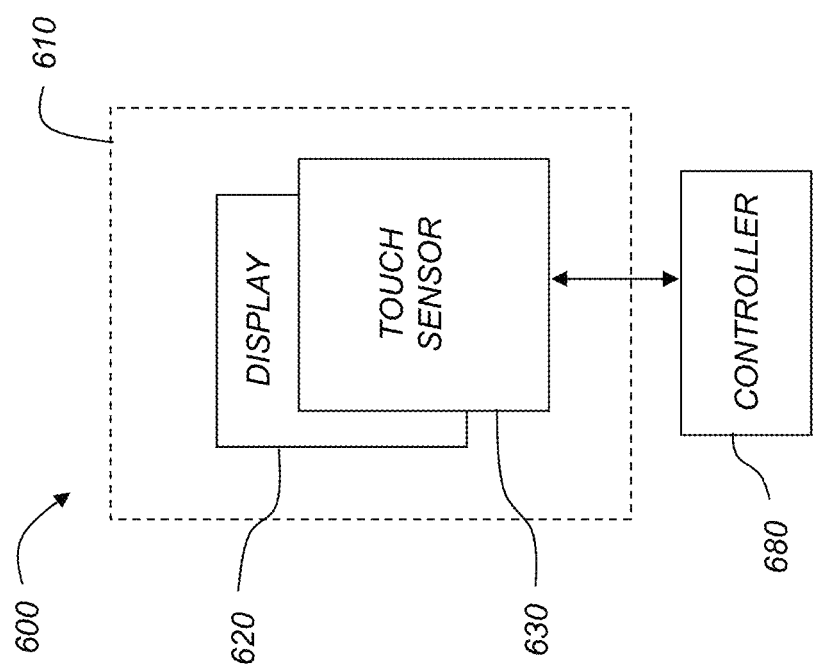
FIG. 3 is a high-level system diagram for an apparatus having a touch screen with a touch sensor that can be printed using embodiments of the invention.

Many types of functional devices can be formed using the flexographic printing system 100 of FIG. 1, and optionally the roll-to-roll electroless plating system 200 of FIG. 2. FIG. 3 shows a high-level system diagram for an exemplary apparatus 600 (i.e., a functional device) having a touch screen 610 including a display device 620 and a touch sensor 630 that overlays at least a portion of a viewable area of display device 620. Touch sensor 630 senses touch and conveys electrical signals (related to capacitance values for example) corresponding to the sensed touch to a controller 680. Touch sensor 630 is an example of an article that can be printed on one or both sides by the flexographic printing system 100 (FIG. 1) and plated using an embodiment of roll-to-roll electroless plating system 200 (FIG. 2) where the web of media 250 is guided by non-contact web guides having liquid ejection hole configurations as described above.

Figure 4:
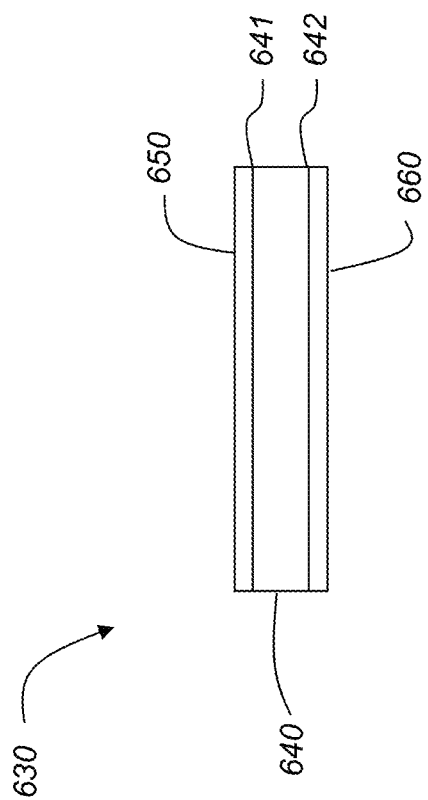
FIG. 4 is a side view of the touch sensor of FIG. 3.

FIG. 4 shows a schematic side view of a touch sensor 630. Transparent substrate 640, for example polyethylene terephthalate, has a first conductive pattern 650 printed and plated on a first side 641, and a second conductive pattern 660 printed and plated on a second side 642. The length and width of the transparent substrate 640, which is cut from the take-up roll 104 (FIG. 1), is typically not larger than the flexographic printing plates 112, 122, 132, 142 of flexographic printing system 100 (FIG. 1), but it could be smaller than the flexographic printing plates 112, 122, 132, 142. Methods for printing longer lengths than the length of the flexographic printing plates are disclosed in U.S. Pat. Nos. 6,684,772 and 9,789,680.

Figure 5:
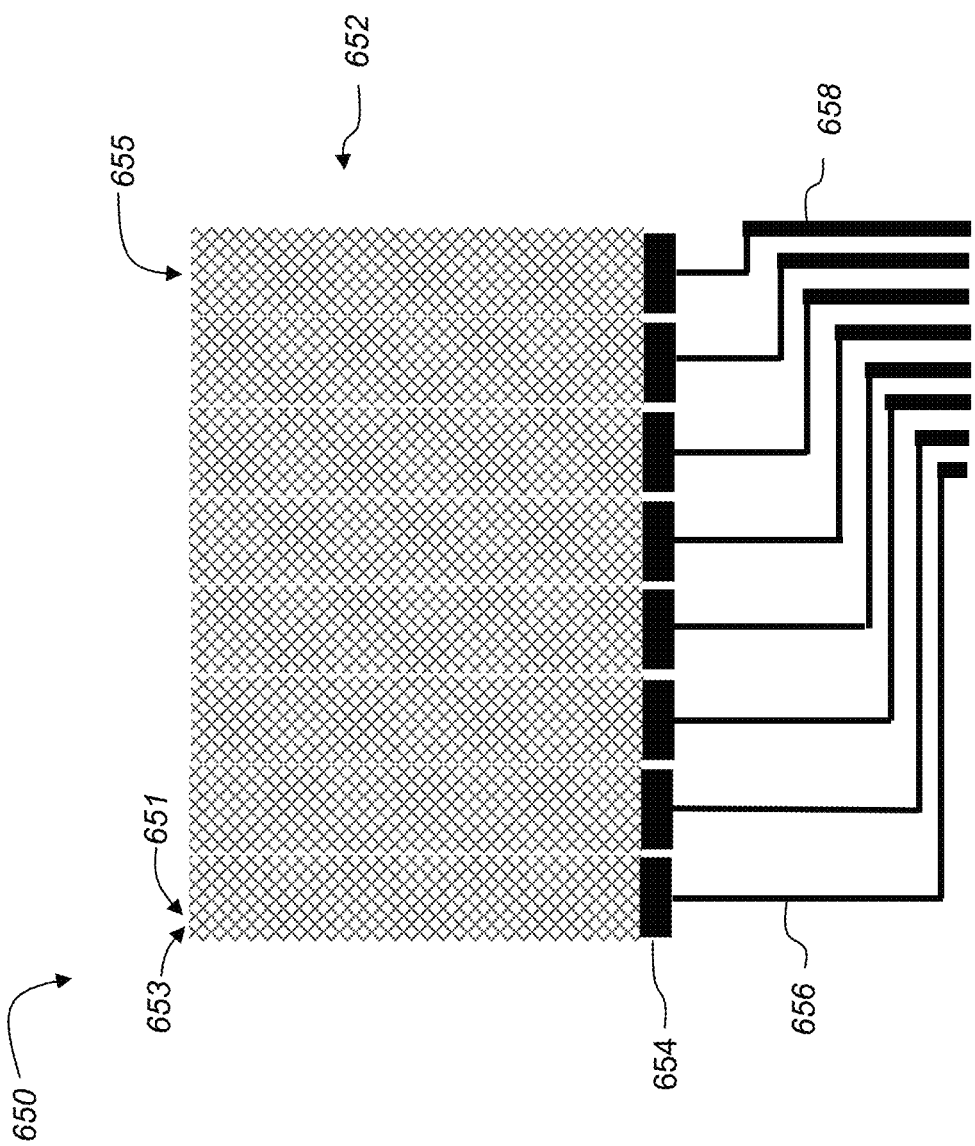
FIG. 5 is a top view of a conductive pattern printed on a first side of the touch sensor of FIG. 4.

FIG. 5 shows an example of a conductive pattern 650 that can be printed on first side 641 (FIG. 4) of transparent substrate 640 (FIG. 4) using one or more print modules such as print modules 120 and 140 of flexographic printing system (FIG. 1), followed by plating using a roll-to-roll electroless plating system 200 (FIG. 2). Conductive pattern 650 includes a grid 652 including grid columns 655 of intersecting fine lines 651 and 653 that are connected to an array of channel pads 654. Interconnect lines 656 connect the channel pads 654 to the connector pads 658 that are connected to controller 680 (FIG. 3). Conductive pattern 650 can be printed by a single print module 120 in some embodiments. However, because the optimal print conditions for fine lines 651 and 653 (e.g., having line widths on the order of 4 to 8 microns) are typically different than for printing the wider channel pads 654, connector pads 658 and interconnect lines 656, it can be advantageous to use one print module 120 for printing the fine lines 651 and 653 and a second print module 140 for printing the wider features. Furthermore, for clean intersections of fine lines 651 and 653, it can be further advantageous to print and cure one set of fine lines 651 using one print module 120, and to print and cure the second set of fine lines 653 using a second print module 140, and to print the wider features using a third print module (not shown in FIG. 1) configured similarly to print modules 120 and 140.

Figure 6:
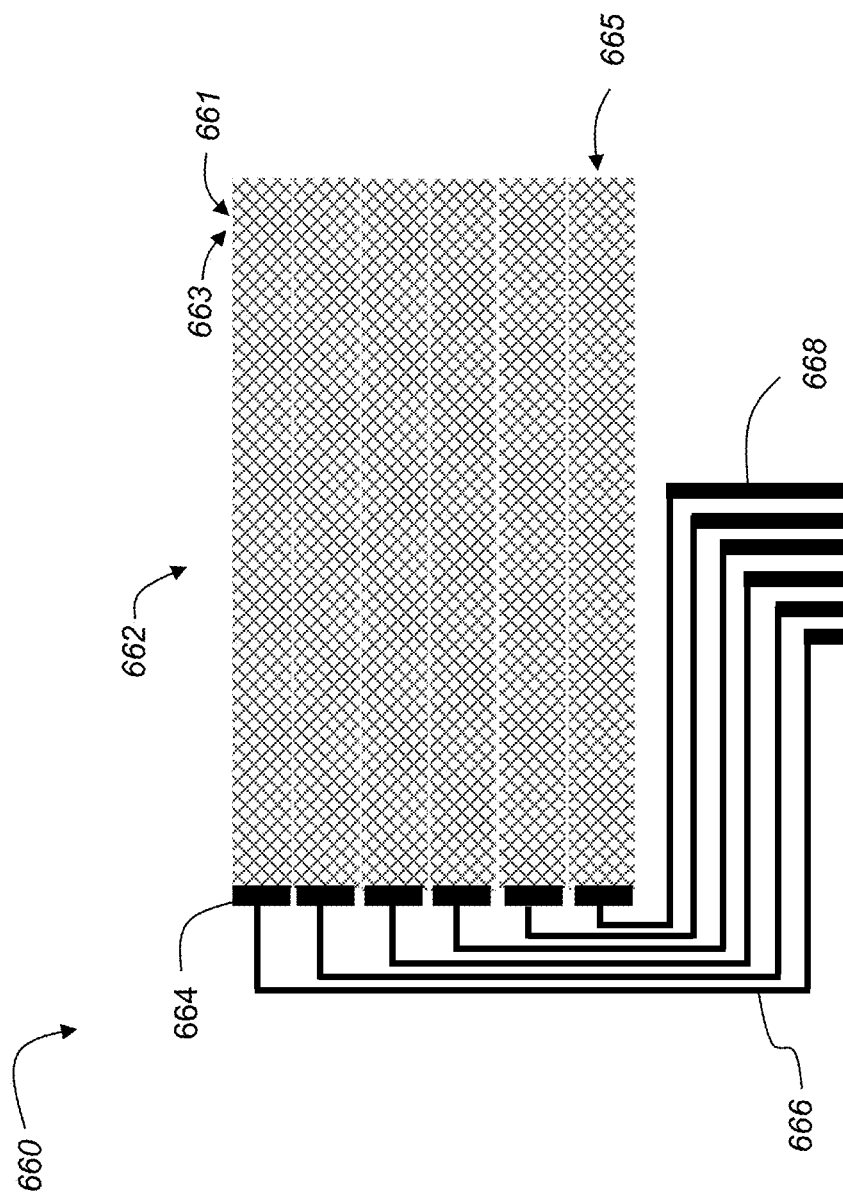
FIG. 6 is a top view of a conductive pattern printed on a second side of the touch sensor of FIG. 4.

FIG. 6 shows an example of a conductive pattern 660 that can be printed on second side 642 (FIG. 4) of substrate 640 (FIG. 4) using one or more print modules such as print modules 110 and 130 of flexographic printing system (FIG. 1), followed by plating using a roll-to-roll electroless plating system 200 (FIG. 2). Conductive pattern 660 includes a grid 662 including grid rows 665 of intersecting fine lines 661 and 663 that are connected to an array of channel pads 664. Interconnect lines 666 connect the channel pads 664 to the connector pads 668 that are connected to controller 680 (FIG. 3). In some embodiments, conductive pattern 660 can be printed by a single print module 110. However, because the optimal print conditions for fine lines 661 and 663 (e.g., having line widths on the order of 4 to 8 microns) are typically different than for the wider channel pads 664, connector pads 668 and interconnect lines 666, it can be advantageous to use one print module 110 for printing the fine lines 661 and 663 and a second print module 130 for printing the wider features. Furthermore, for clean intersections of fine lines 661 and 663, it can be further advantageous to print and cure one set of fine lines 661 using one print module 110, and to print and cure the second set of fine lines 663 using a second print module 130, and to print the wider features using a third print module (not shown in FIG. 1) configured similarly to print modules 110 and 130.

Alternatively, in some embodiments conductive pattern 650 can be printed using one or more print modules configured like print modules 110 and 130, and conductive pattern 660 can be printed using one or more print modules configured like print modules 120 and 140 of FIG. 1 followed by plating using a roll-to-roll liquid processing system.

Alternatively, in some embodiments grid columns 655 and grid rows 665 can be configured as uniform image regions 305 to which transparent conductive materials are applied to provide a similar function to the intersecting fine lines 651 and 653, and intersecting fine lines 661 and 663, respectively. Transparent conductive materials such as silver nanowires, organic conductors or transparent conductive oxide inks can printed in these uniform image regions 305.

With reference to FIGS. 3-6, in operation of touch screen 610, controller 680 can sequentially electrically drive grid columns 655 via connector pads 658 and can sequentially sense electrical signals on grid rows 665 via connector pads 668. In other embodiments, the driving and sensing roles of the grid columns 655 and the grid rows 665 can be reversed.

As discussed in the background section, it has been observed that when conventional flexographic printing methods are used to print functional device patterns artifacts are prone to occur, particularly in uniform image regions. Such artifacts would include trailing-edge voids, viscous fingering and pinholes. The Kodak DigiCap NX patterning process is described in the aforementioned white papers: "Kodak DigiCap NX Patterning," "KODAK FLEXCEL NX SYSTEM: Conquering Edge Definition," and "KODAK FLEXCEL NX SYSTEM: Effective Ink Transfer," which are incorporated herein by reference. This process adds a periodic texture pattern to the flexographic printing plate in uniform image regions to improve the uniformity of the printed image in those areas. However, when such methods have been applied to the printing of functional device patterns, which are at a significantly finer scale than conventional flexographic printing patterns, it has been found that artifacts are still present in the printed device pattern which can significantly degrade the performance of the functional device. The artifacts appear to result from an interaction of the periodic structure on the surface of the flexographic printing plate and the periodic structure of the anilox roller surface. These artifacts are more significant than for the printing of conventional flexographic images both because of the finer resolution and feature size required for printing functional device patterns, as well as the enhanced sensitivity to artifacts due to the impact that such artifacts can have on the performance of the functional device.

It has been discovered that replacing the conventional periodic patterns of raised features in the uniform image regions of the flexographic printing plate with raised features having pseudo-random feature positions can substantially reduce the presence of these artifacts (e.g., trailing-edge void, viscous fingering and pinholes). The resulting fine pattern of raised features does not negatively interact with the periodic pattern of cells on the surface of the anilox roller.

Figure 7:
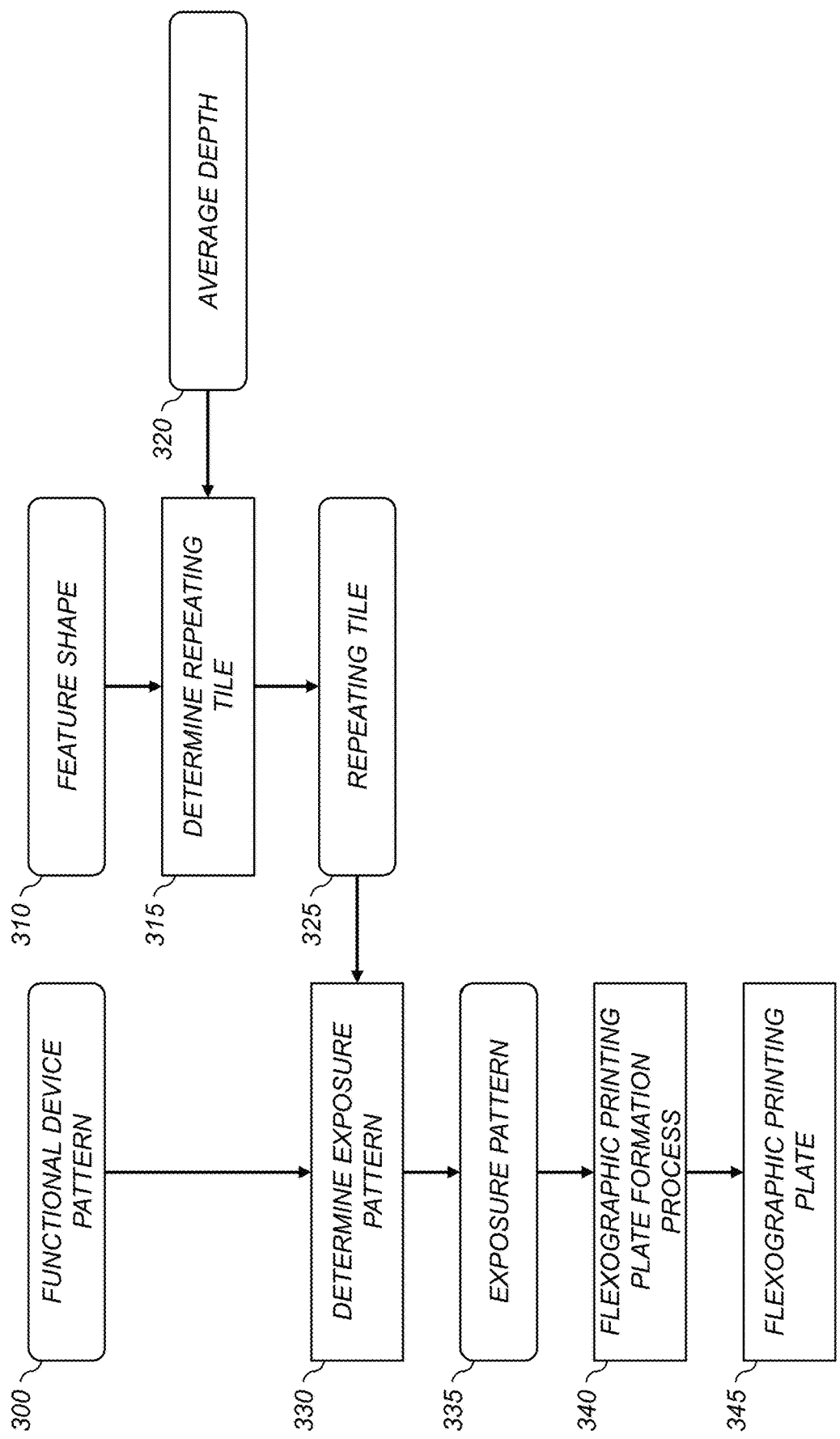
FIG. 7 is a flowchart of a method for fabricating flexographic printing plates in accordance with an exemplary embodiment.

FIG. 7 shows a flowchart of a method for fabricating a flexographic printing plate for printing functional device patterns in accordance with an exemplary embodiment. An input to the process is a functional device pattern 300, which includes one or more uniform image areas. Examples of functional device patterns 300 that can be printed using the method of the present invention include patterns for layers or components of functional devices such as touch screens, antennas, transistors, liquid crystal displays, OLED displays and circuit boards. While the invention will be described with respect to printing functional device patterns 300, one skilled in the art will recognize that it can be equally applied to the printing of any kind of image patterns including text patterns, graphics patterns, and photographic image patterns.

Figure 8:
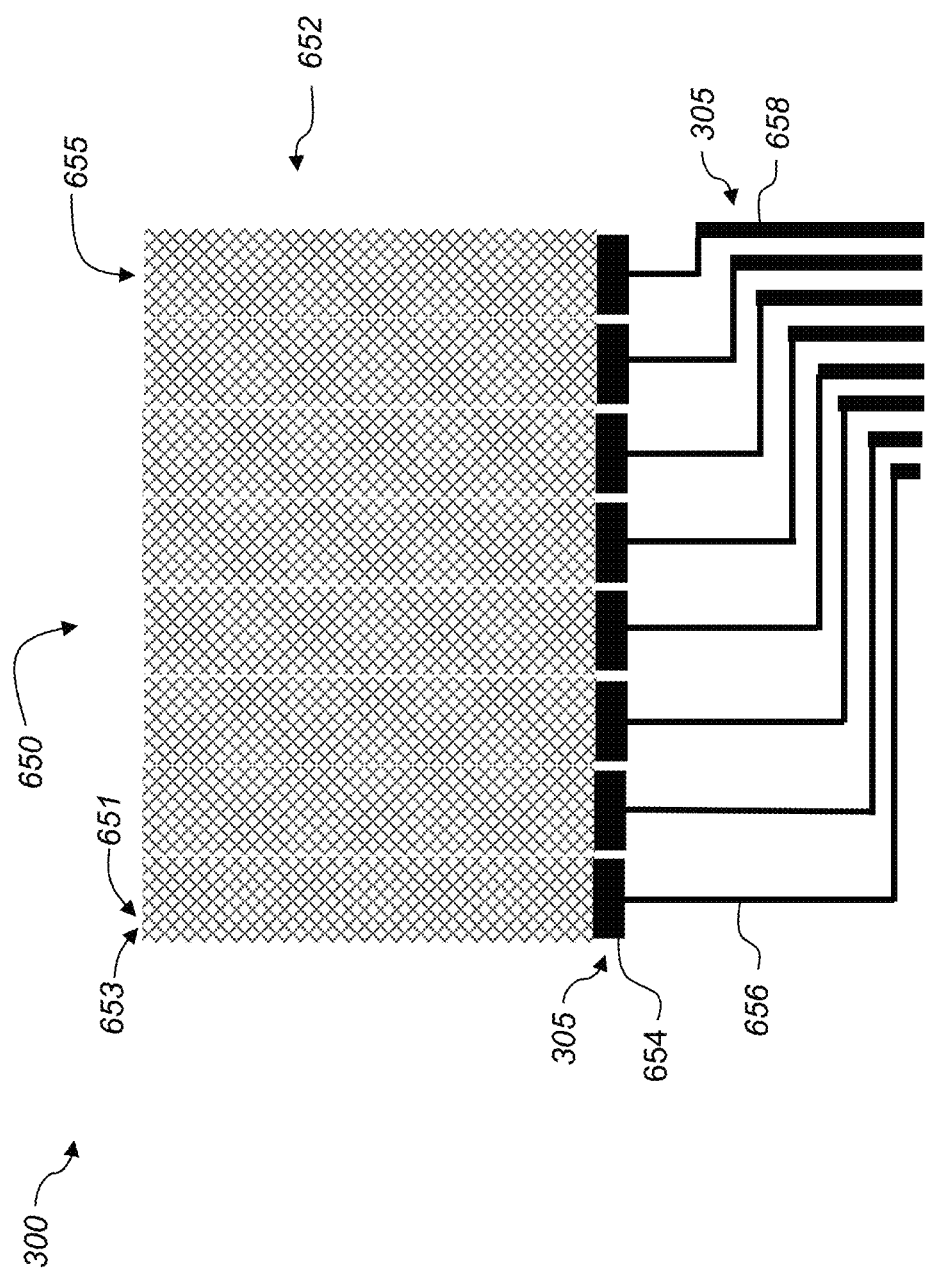
FIG. 8 illustrates an exemplary functional device pattern.

FIG. 8 shows an exemplary functional device pattern 300 that corresponds to the conductive pattern 650 (FIG. 5) for a layer of the touch screen device described earlier with respect to FIGS. 3-6. The functional device pattern 300 includes uniform image regions 305 corresponding to the channel pads 654 and the connector pads 658. Depending on the line width, the interconnect lines 656 may also be classified as uniform image regions 305. The uniform image regions 305 are susceptible to being printed with image artifacts such as trailing-edge voids, viscous fingering and pinholes when printed using conventional flexographic printing methods.

In some embodiments grid rows 655 and grid columns 665 can be configured as uniform image regions 305 to which transparent conductive materials are applied to provide a similar function to the intersecting fine lines 651 and 653, and intersecting fine lines 661 and 663, respectively. Transparent conductive materials such as silver nanowires, organic conductors or transparent conductive oxide inks can printed in these uniform image regions 305.

Returning to a discussion of FIG. 7, a determine plate formation pattern step 330 is used to determine a plate formation pattern 335 corresponding to the functional device pattern 300. This step includes applying a repeating tile 325 in a tiled arrangement to the uniform image regions 305 (FIG. 8) within the functional device pattern 300. The repeating tile 325 is an array of pixels values defining a pattern of features to be formed within the uniform image regions 305. As will be discussed later, the repeating tile 325 includes a plurality of feature shapes that are positioned in a pattern of pseudo-random feature locations within the repeating tile 325. When the plate formation pattern 335 is used to form a flexographic printing plate 345 using a flexographic printing plate formation process 340, the pattern of feature shapes in the repeating tile 325 will form a corresponding pattern of raised features in the uniform image regions 305. The number of feature shapes within the repeating tile 325 is selected to provide a specified average depth for the pattern of raised features in the uniform image regions 305 of the flexographic printing plate 345.

It should be noted that while the present invention is described using exemplary embodiments in which the flexographic printing plate formation process 340 using an optical writing process to expose a radiation sensitive material using an optical "exposure pattern" corresponding to the plate formation pattern 335, other types of processes can be used to form the flexographic printing plate 345 which may use other types of patterning processes. The term "exposure pattern" should therefore be taken to include image-wise patterns that are provided to other types of plate formation devices including thermal patterns, ablation patterns and etching patterns. Generally, the plate formation pattern 335 will be a digital image pattern including an array of pixel values that are used to control the flexographic plate formation process 340 as a function of spatial position.

Figure 9:
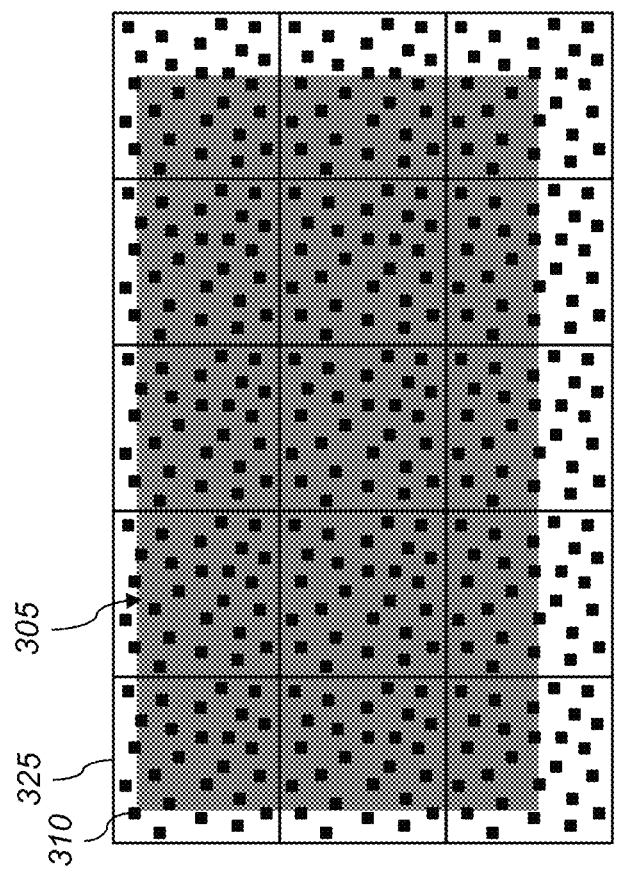
FIG. 9 shows an exemplary uniform image region overlaid by a pattern of repeating tiles in a tiled arrangement.

FIG. 9 illustrates an exemplary uniform image region 305 (represented by the gray rectangle) overlaid with a set of repeating tiles 325 in a tiled arrangement. Each repeating tile 325 includes a set of feature shapes 310 that are distributed throughout the repeating tile 325 in pseudo-random feature locations. In this example, the feature shapes 310 are 2×2 squares of pixels. Within the context of the present disclosure, the term "tiled arrangement" refers to an arrangement where the repeating tile 325 is repeated horizontally and vertically in an array to cover the uniform image region 305.

Generally, the size of the repeating tile 325 and the size and number of the feature shapes 310 should be defined such that the resulting pattern is sufficiently "random" when the repeating tiles 325 are arranged in the tiled arrangement. Preferably, the repeating tile 325 should be at least 10×10 pixels (i.e., having an area of at least 100 square pixels), and more preferably should be at least 50×50 pixels (i.e., having an area of at least 2500 square pixels). While there is no maximum size limitation for the repeating tile 325, there will typically be no benefit to using tiles sizes larger than about 2000×2000 pixels. Preferably, at least ten feature shapes 310 should be distributed within the repeating tile, and the feature shapes 310 should cover between 2-30% of the area of the repeating tile 325.

The repeating tile 325 includes an array of tile pixel values $T(x_t, y_t)$ which take on a first value (e.g., "1") at pixel positions corresponding to the feature shapes 310, and take on a second value (e.g., "0") at intervening pixel positions, where $x_t$ is the horizontal pixel position within the repeating tile 325, and $y_t$ is the vertical pixel position within the repeating tile 325.

In an exemplary embodiment, the repeating tile 325 is "applied" to the uniform image region by replacing the pixel values of the functional device pattern 300 corresponding to the uniform image regions 305 with the pixel values in the corresponding pixel positions in the repeating tile 325. Mathematically, the corresponding pixel positions $(x_t, y_t)$ in the repeating tile 325 can be computed using the equations:

$$x_t = \mod(x, M_x)$$

$$y_t = \mod(y, M_y) \qquad (1)$$

where (x, y) is a pixel position in the functional device pattern 300 within one of the uniform image regions 305, $M_x$ and $M_y$ are the array sizes of the repeating tile 325 in the x and y dimensions, respectively, and mod( ) is the well-known "modulo operator" which determines the remainder when the first argument is divided by the second argument. The modulo operations have the effect of tiling the repeating tile 325 over the uniform image regions 305.

Returning to a discussion of FIG. 7, the determine plate formation pattern step 330 generally applies the repeating tile 325 to the elements of the functional device pattern 300 corresponding to the uniform image regions 305. In a preferred embodiment, the repeating tile 325 is not applied to other portions of the functional device pattern 300 that do not correspond to the uniform image regions 305. In other embodiments, the repeating tile can be applied in all regions, or a different pattern can be applied to other portions of the functional device pattern 300 that do not correspond to the uniform image regions 305. In some embodiments, the uniform image regions 305 can be designated by a user using a manual process where certain elements of the functional device pattern 300 are designated to be uniform image regions 305 and other elements are designated to be other types of patterns (e.g., thin lines, mesh patterns, etc.) which would not benefit from the pattern of raised features produced by the application of the pattern of feature shapes 310 in the repeating tile 325.

In other embodiments, the uniform image regions 305 can be identified by automatically analyzing the functional device pattern 300. In an exemplary embodiment, each element of the functional device pattern 300 is detected and analyzed to determine the dimensions (e.g., the element width and the element height). Algorithms for detecting elements of a binary image pattern are well-known in the image analysis art, and any such algorithm can be used in accordance with the present invention. Any element where the minimum element dimension exceeds a predefined threshold dimension is then designated to be a uniform image region. In exemplary configuration, the threshold dimension is selected so that it is about twice an average center-to-center spacing between the feature shapes 310 in the repeating tiles 325. (Within the context of the present disclosure the center-to-center spacing between feature shapes for a particular feature shape refers to the center-to-center distance to the nearest feature shape.) In one example, the feature shapes 310 are 6 μm squares distributed throughout the repeating tile 325 with an average feature spacing of about 20 μm. In this case an appropriate threshold dimension is about 40 μm.

The repeating tile 325 is determined using a determine repeating tile step 315 by distributing a plurality of feature shapes 310 in a pattern of pseudo-random feature locations within the repeating tile 325. The number of feature shapes 310 to be included within the repeating tile 325 is preferably selected to provide a specified average depth 320 for the pattern of raised features that are formed in the uniform image regions 305 when the plate formation pattern 335 is used to form a flexographic printing plate 345. The average depth 320 will control the thickness of the ink layer that is transferred to the substrate 150 (FIG. 1) when the flexographic printing plate 345 is used in the flexographic printing system 100 (FIG. 1). The pattern of pseudo-random feature locations is preferably determined in such a manner that the spacing between neighboring feature locations is approximately uniform. Such patterns are often referred to as "blue-noise patterns."

Figure 10:
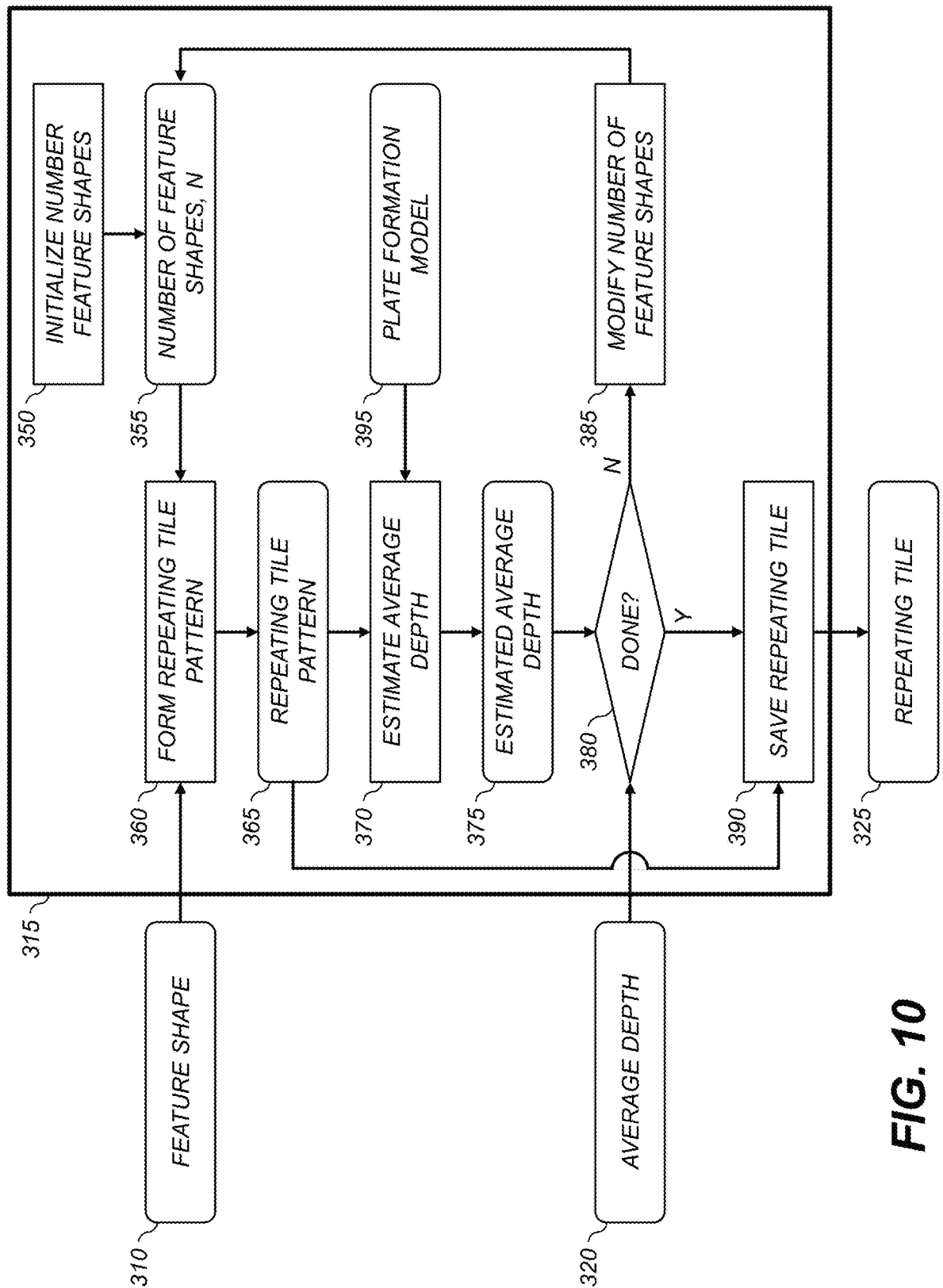
FIG. 10 is a flowchart showing additional details of the determine repeating tile step of FIG. 7.

FIG. 10 is a flowchart showing additional details of the determine repeating tile step 315 of FIG. 7 in accordance with an exemplary embodiment. The illustrated method uses an iterative process to determine the number of feature shapes 310 that should be included in the repeating tile 325 in order to form a flexographic printing plate 345 (FIG. 7) having a specified average depth 320. An initialize number feature shapes step 350 is used to initialize a number of feature shapes (N) 355 to an initial value. In some embodiments the initial value can be set based on a preliminary experiment in which flexographic printing plates 345 are formed using the specified feature shape 310 for a range of different values for the number of feature shapes 355.

A form repeating tile pattern step 360 is used to form a repeating tile pattern 365 having N feature shapes 310 distributed in pseudo-random feature positions. Within the context of the present disclosure "pseudo-random feature positions" refer to irregularly spaced features positions, which are preferably selected to avoid "clumps" of closely spaced feature positions. In an exemplary configuration the pseudo-random feature positions are distributed according to a so-called "blue-noise" pattern. (As is well-known in the digital imaging art, particularly in the digital halftoning art, blue-noise patterns are pseudo-random spatial patterns that are biased toward high spatial frequencies and have reduced low-frequency content such that they have a reduced visibility to a human observer compared to random "white-noise" patterns.)

The feature shape positions for the N feature shapes 310 can be determined using any appropriate method known in the art. In an exemplary embodiment, the process described below relative to FIG. 14 can be used to determine the feature shape positions and form the repeating tile pattern 365. In other embodiments, a halftoning process can be used to determine the feature shape positions. For example, a blue-noise dither halftoning process can be used to determine the feature shape positions by halftoning a uniform field having a tone level which will provide the specified number of feature shapes 355 within the repeating tile pattern 365. Examples of such halftoning methods are described in the article entitled "Methods for generating blue-noise dither matrices for digital halftoning" by K. E. Spaulding et al. (J. Electron. Imaging, Vol. 6, pp. 208-230, 1997), which is incorporated herein by reference. When blue-noise dither halftoning processes are applied to a uniform field, the pattern of "on" pixels are effectively determined by thresholding a blue-noise dither matrix. The feature shape positions will then correspond to the positions of the "on" pixels. In other embodiments, an error diffusion halftoning process can be used to determine the feature shape positions. One example of an appropriate error diffusion halftoning process that can be used in accordance with the present invention is described in the article entitled "Adaptive error diffusion algorithm incorporating a visual model" by K. E. Spaulding et al. (J. Electron. Imaging, Vol. 7, pp. 655-663, 1998), which is incorporated herein by reference. It will be recognized by one skilled in the art that a wide variety of different error diffusion algorithms, and other types of halftoning algorithms, exist in the art which produce halftone patterns having appropriate blue-noise characteristics which can be used in accordance with the present invention.

Once the feature shape positions are determined, the form repeating tile pattern step 360 forms the repeating tile pattern 365 by placing a feature shape 310 at each of the designated feature shape positions. A particular pixel within the feature shape 310 can be designated to be the pixel position which is aligned with the feature shape position when the feature shape 310 is placed in the repeating tile pattern 365. For feature shape positions near the edge of the repeating tile pattern 365, the feature shapes 310 may extend beyond the edges of the repeating tile pattern 365. In this case, the portions of the feature shapes 310 that extend beyond the edge should be "wrapped around" to the opposite side of the repeating tile pattern 365.

Figure 11:
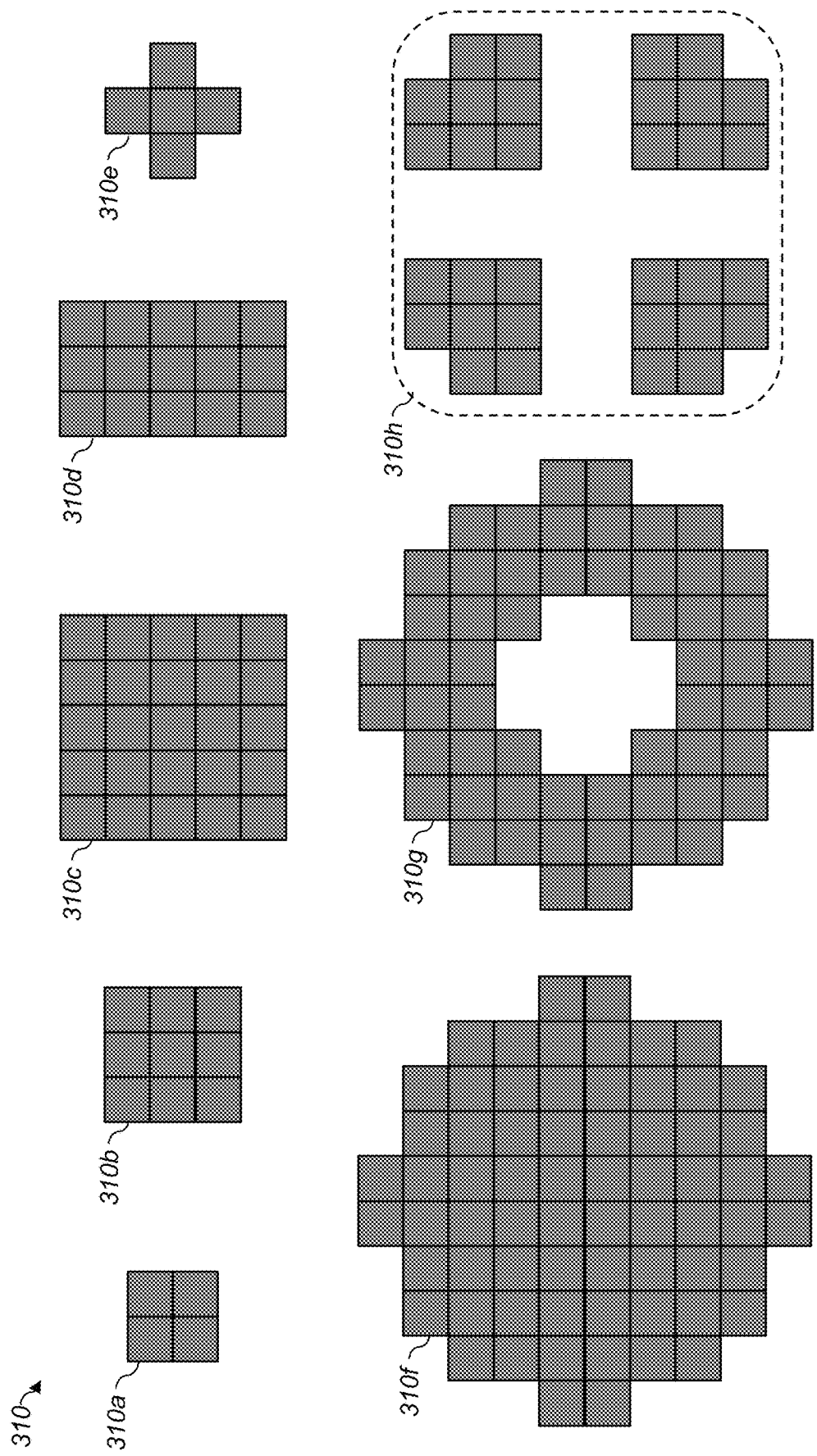
FIG. 11 shows exemplary feature shapes that can be used to form repeating tiles in accordance with the present invention.

FIG. 11 shows examples of different types of feature shapes 310 that can be used to form the repeating tile patterns 365 of the present invention. In these examples, feature shape 310a is a 2×2 square of pixels; feature shape 310b is a 3×3 square of pixels; feature shape 310c is a 5×5 square of pixels; feature shape 310d is a 3×5 rectangular array of pixels; feature shape 310e is a "plus sign" shape; feature shape 310f is a 10-pixel diameter circular shape; feature shape 310g is a 10-pixel diameter annular shape providing a "well" in the center; and feature shape 310h is a 10-pixel diameter circle with 2-pixel wide vertical and horizontal channels of pixels removed to leave four distinct isolated regions in the feature shape separated by fluid channels. It will be obvious to those skilled in the art that many other different types of feature shapes 310 can also be used in accordance with the present invention. Preferably the feature shapes 310 will have an area of at least two square pixels (i.e., 2×1 or 1×2), although in some cases single pixel feature shapes could be used. The feature shapes 310 will typically have an area of no more than about 100 square pixels. The feature shapes 310 used in a particular application can be selected to promote cell formation, fluid flow, and fluid transfer depending upon the nature of the fluid, the intended thickness of the transferred fluid, and the characteristics of the substrate, such as compressibility, surface roughness, and surface energy. Feature shapes can also be selected to minimize negative interactions, such as with respect to the size and shape of anilox cells, or when raised features on the substrate surface might interfere with uniform ink transfer.

Once a candidate repeating tile pattern 365 is determined, an estimate average depth step 370 is used to determine an estimated average depth 375 using a plate formation model 395 which models the flexographic printing plate formation process 340 (FIG. 7). The plate formation model 395 determines an estimated surface profile including the pattern of raised features corresponding to the pattern of feature shapes 310. The average depth of the surface profile is then computed to determine the estimated average depth 375.

In an exemplary flexographic printing plate formation process 340, a mask material, such as the commercially available Kodak EKTAFLEX Thermal Imaging Layer material is exposed to radiation in an image-wise fashion using an imaging system in accordance with the plate formation pattern 335 (FIG. 7) to form a mask image. In an exemplary embodiment, the radiation is provided by a commercially available Kodak EKTAFLEX Imager, which uses an infrared laser to ablate portions of the mask layer where it is desired to produce raised features on the flexographic printing plate 345. The spatial resolution of the preferred imaging system is 12,800 dpi such that the pixels of the plate formation pattern 335 have a pixel size of approximately 2 μm, although the spatial resolution can range from 2400 dpi to 26,000 dpi. The mask material is then laminated to a photosensitive printing plate, such as a Kodak EKTAFLEX Plate that includes a photosensitive photopolymer layer over a substrate so that the mask material is in an intimate contact with the photopolymer layer of the photosensitive printing plate. In an exemplary embodiment, lamination is performed using a commercially available Kodak Flexcel NX laminator. In an exemplary embodiment, the photosensitive printing plate is of a type similar to that described in U.S. Pat. No. 9,315,062, which is incorporated herein by reference, and can be comprised of one or more elastomeric layers, with or without a substrate, in which a relief image can be generated using suitable imaging means. For example, the relief layer comprising a relief pattern can be disposed on a suitable substrate. The laminated photosensitive printing plate is then exposed to radiation to form a latent image in the photopolymer layer. Various commercially available UV exposure devices may be used to perform this operation. In an exemplary embodiment, the UV radiation supplied by a commercially available Concept 302 EDLF system available from Mekrom Engineering. Where the mask image has been ablated, the radiation passes through the mask layer and exposes the photopolymer layer, thereby cross-linking and hardening the photopolymers to provide a developable latent image. It may be necessary to increase the UV radiation exposure time typically required to form the developable latent image in to completely form feature shapes 355, especially if smaller area feature shapes 355 are used. After the latent image has been formed, the mask material is removed, and the photosensitive printing plate is processed to provide a developed relief image thereby providing the flexographic printing plate 345. The processing operation (sometimes referred to as "developing the printing plate") involves removing the unexposed portions of the photopolymer layer where were not hardened by the radiation leaving raised features corresponding to the cross-linked polymer regions. In accordance with the present invention, the photopolymer layer is made of an aqueous-processable photopolymer so that the processing operation uses an aqueous processing solution (i.e., a water-based processing solution), typically including an active ingredient such as a dispersing agent. In an exemplary embodiment, the photosensitive printing plate is processed using a solvent based processing solution.

Alternative embodiments can employ the Kodak Flexcel NX Thermal Imaging Layer, Kodak Flexcel NX Plate and the Kodak Trendsetter NX Imager in place of the corresponding Kodak EKTAFLEX products.

Additional embodiments also include the use of water processable plates such as the Kodak Flexcel NX Ultra Plate with Kodak Flexcel NX Ultra water-based processing solution.

Figure 12:
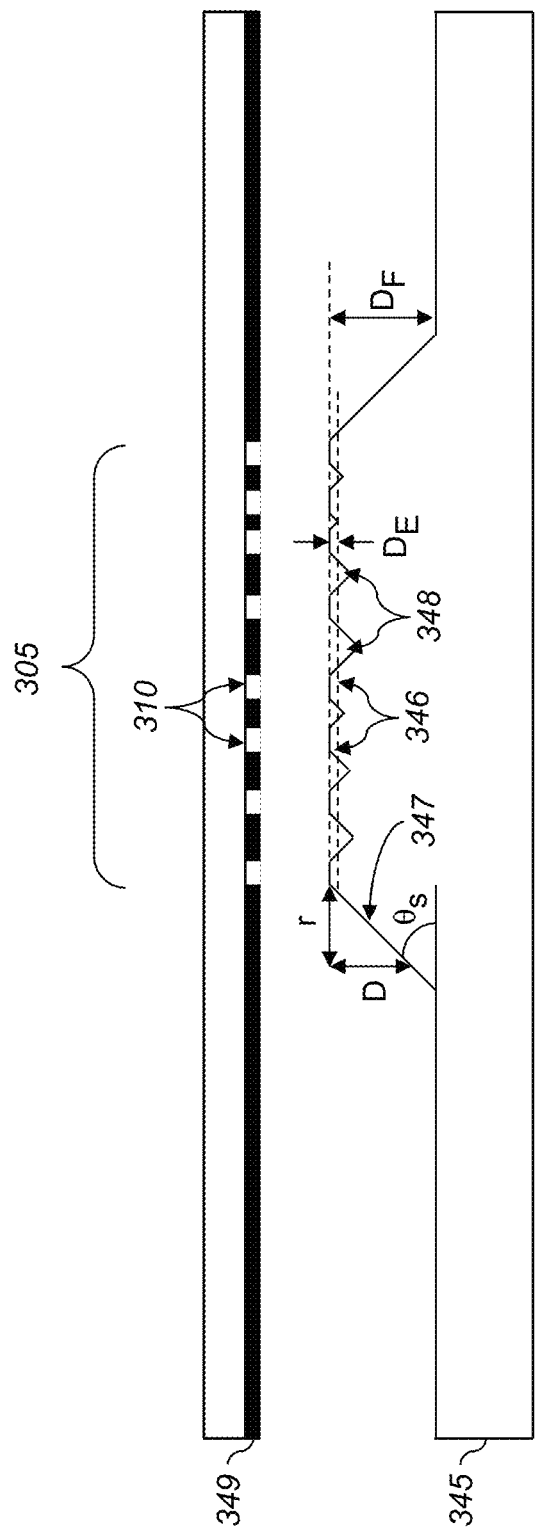
FIG. 12 illustrates a cross-section through an exemplary flexographic printing plate.

FIG. 12 illustrates a cross-section through an exemplary flexographic printing plate 345 formed using a flexographic printing plate formation process 340. The flexographic printing plate 345 includes a pattern of raised features 346 corresponding to the pattern of feature shapes 310 in the uniform image regions 305 of a mask image 349 formed from the plate formation pattern 335 (FIG. 7). A characteristic of typical flexographic printing plate formation processes 340 is that the resulting raised features 346 have shoulders 347 which fall-off at a shoulder angle $\theta_s$ from the surface of the flexographic printing plate 345. Within the region of the flexographic printing plate 345 corresponding to the uniform image region 305, valleys 348 are formed between the raised features 346. At the edges of the uniform image region 305, the shoulders 347 fall off until they reach a floor depth $D_F$.

The plate formation model 395 is used to model the flexographic printing plate formation process 340. In an exemplary embodiment, the plate formation model 395 works by computing an estimated depth profile D(x,y) corresponding to the plate formation pattern 335. With respect to the estimate average depth step 370 in the process of FIG. 10, the plate formation model 395 computes a depth profile corresponding to the repeating tile pattern 365 in a uniform image region 305. To eliminate edge effects, a pattern corresponding to a 3×3 array of repeating tile patterns 365 is analyzed and the estimated average depth 375 is determined in the area corresponding to the central repeating tile pattern 365. At each x-y position, a distance r is computed to the edge of the nearest feature shape 310. The depth profile D(x,y) can then be estimated by:

$$D(x,y)=\text{Min}(r\,\text{Tan}(\theta_s),D_F) \quad (2)$$

where the function Min(•) returns the smallest of its arguments. In this case, the Min(•) function has the effect of limiting the depth to the predefined floor depth $D_F$. In an exemplary configuration, the depth profile is determined using a shoulder angle $\theta_s$=53°. In other embodiments, the shoulder angle can be in the range of 40°≤$\theta_s$≤60°, or more preferably in the range of 45°≤$\theta_s$≤55°.

Preferably, the depth profile D(x,y) is determined for an array of x-y positions having a resolution that is at least as high as the resolution of the repeating tile pattern 365. In an exemplary embodiment, the preferred resolution is 12,800 dpi, corresponding to a pixel width of 2 μm. Once the depth profile D(x,y) is determined, the estimated average depth ($D_E$) 370 is determined by computing the average depth of the depth profile in the area corresponding to the central repeating tile pattern 365.

After the estimated average depth 375 is determined, a done test 380 is used to compare the estimated average depth ($D_E$) 375 to the specified aim average depth ($D_A$) 320. If the estimated average depth 375 differs from aim average depth 320 by less than a predefined threshold ($T_D$), (i.e., if |$D_A$-$D_E$|≤$T_D$) then the iterative process is terminated and a save repeating tile step 390 is used to save the repeating tile pattern 365 as the repeating tile 325. Otherwise, a modify number of feature shapes step 385 is used to modify the number of features shapes 355 accordingly and the process is repeated. For example, if the estimated average depth 375 is less than the aim average depth 320 then the number of features shapes 355 can be reduced, and if the estimate average depth 375 is greater than the aim average depth 320 then the number of features shapes 355 can be increased. In various embodiments, the magnitude of the reduction or increase in the number of feature shapes 355 can be made using different methods. For example, in some embodiments an approximate local slope ($dD_E$/dN) which relates the change in the estimated average depth 375 to the change in the number of feature shapes 355 can be determined by computing the estimated average depth as several different values of N and fitting a linear function. The increase or decrease in the number of feature shapes 355 can then be estimated from the approximate local slope based on the magnitude of the average depth error:

$$\Delta N=\Delta D/(dD_E/dN) \quad (3)$$

where $\Delta D=D_A-D_E$. In other embodiments, the number of features shapes can be increased or decreased by a coarse increment until the estimated average depth 375 is close to the specified aim average depth 320, and then it can be increased or decreased by a fine increment until the done test 380 is satisfied.

Figure 13:
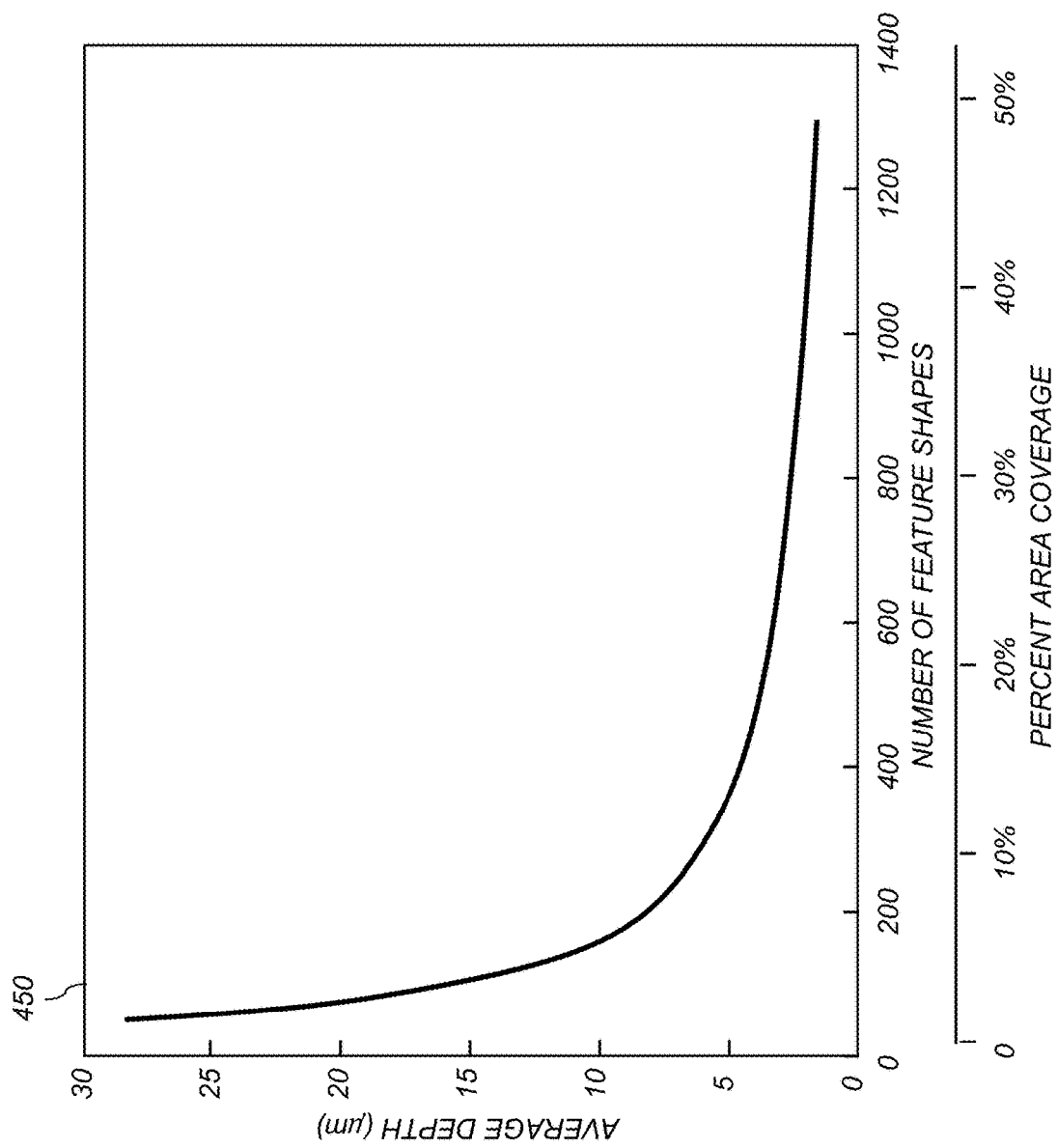
FIG. 13 is a graph showing an exemplary relationship between the average depth of the flexographic printing plate surface profile and the number of feature shapes.

FIG. 13 shows a graph 450 of the estimated average depth as a function of the number of feature shapes determined using the above-described method. In this example, 3×5 feature shapes 310d (FIG. 11) were placed into a 200×200 repeating tile 325. The number of feature shapes, together with the feature size and the repeating tile size can be used to determine corresponding percent area coverage values representing the fraction of the surface covered by the raised features. In some embodiments, a curve like this can be determined for a feature shape and tile size of interest. The number of feature shapes 355 required to produce a desired aim average depth 320 can then be determined from the curve.

In an exemplary embodiment, the aim average depth 320 is determined in order to provide a desired amount of ink to the substrate 150 (FIG. 1) during the flexographic printing process. For a given thickness of ink to be transferred to the substrate 150, it is assumed generally that an equal thickness of ink remains on the flexographic printing plate 345. Therefore, the aim average depth of the flexographic printing plate 345 should be about twice the desired thickness of the transferred ink. Likewise, the average depth of the anilox roller pattern should be about twice the thickness of the ink on the flexographic printing plate 345 and four times the thickness of the ink to be transferred to the substrate 150. The actual amount of ink transferred from anilox roller 115 to the flexographic printing plate 345 to the substrate 150 can vary depending upon ink viscosity and rheology, surface tension, and elasticity, substrate surface roughness and surface energy, anilox and flexographic printing plate surface energy, and printing speed. In some configurations, an aim average depth 320 of 7.0 μm has been found to produce good results with a 10 BCMI anilox roller. The aim average depth will typically be between 1.0 to 20 win, and more typically between 1.5 to 15 μm for many applications.

In an exemplary embodiment, the plate formation pattern 335 (FIG. 3) is written at a resolution of 12,800 dpi so that each pixel has a size of about 2 μm. Accordingly, the 2×2 pixel feature shape 310a of FIG. 11 would have a feature size of about 4 μm. In various embodiments the feature sizes of the feature shapes 310 would typically be between 2-20 μm, and would preferably be between 4-8 win. The number of feature shapes that will produce the aim average depth will generally result in an average center-to-center feature spacing of the feature shapes 310 in the repeating tile pattern 365 in the range of 5-50 μm, and more typically would be in the range of 10-30 win.

Figure 14:
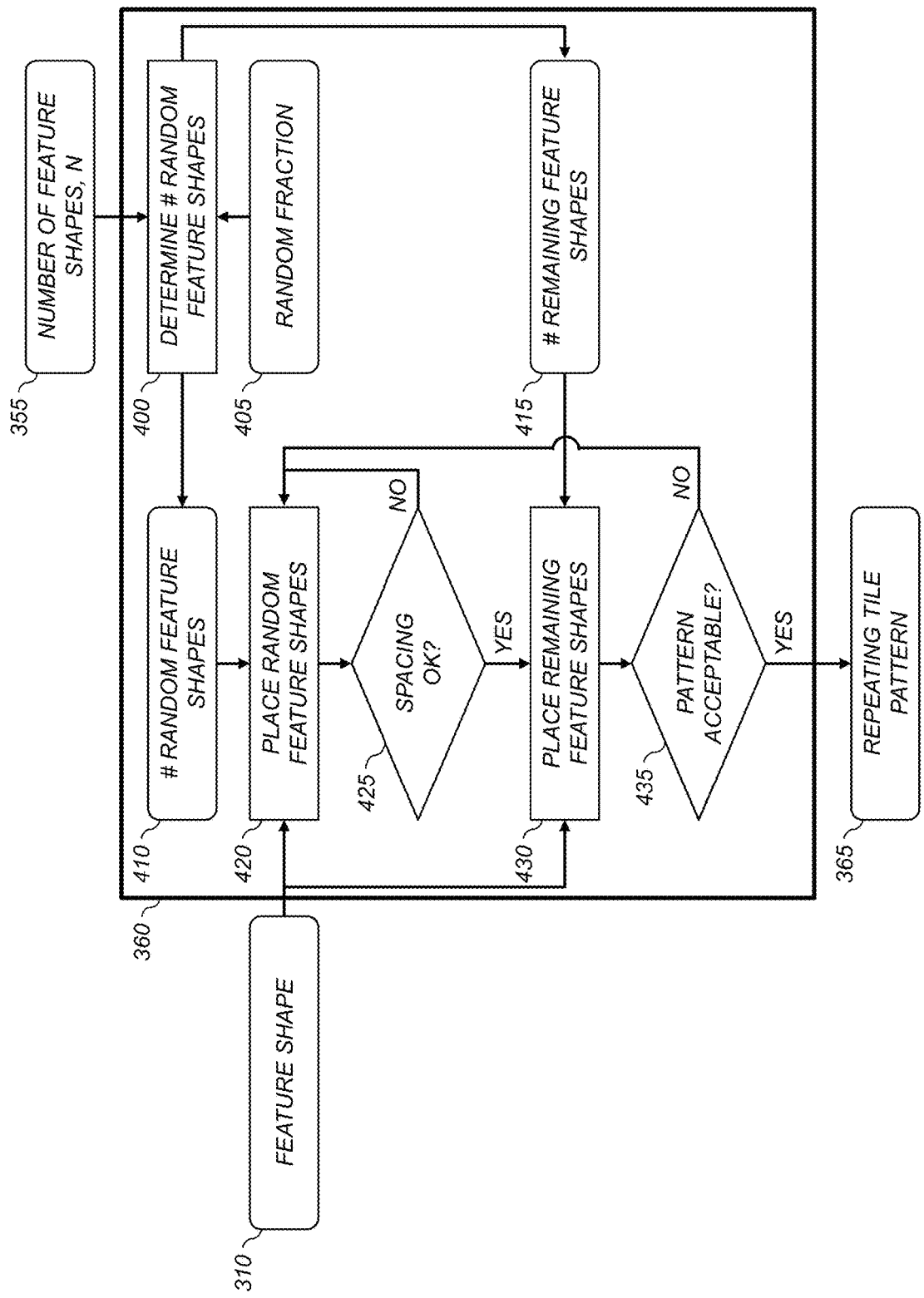
FIG. 14 is a flowchart showing additional details of the form repeating tile pattern step of FIG. 10.

FIG. 14 is a flowchart showing additional details of the form repeating tile pattern step 360 of FIG. 10 in accordance with an exemplary embodiment. With the method, a fraction of the feature shapes 310 (specified by random fraction 405) are randomly placed within the repeating tile pattern 365, and the remaining feature shapes 310 are positioned in the largest gaps. A determine number of random feature shapes step 400 is used to determine a number of random feature shapes 410 by multiplying the number of feature shapes 355 by the random fraction 405. The determine number of random feature shapes step 400 also determines number of remaining feature shapes 415 by subtracting the number of random feature shapes 410 from the number of feature shapes 355.

A place random feature shapes step 420 places a first set of feature shapes 310 at random positions within the repeating tile pattern 365. Note that any portions of the placed feature shapes 310 that overlap an edge of the repeating tile pattern 365 are wrapped around to the opposite edge.

A spacing OK test 425 is used to check the random shape positions to make sure that a minimum distance between the random shape positions is greater than a predefined threshold distance. (This ensures that the shapes will generally not overlap and that they are not clustered too closely together.) If any of the random shape positions are too close to each other the place random feature shapes step 420 is re-executed with a different random number seed until an acceptable set of feature positions is found.

Next a place remaining features step 430 is used to place the remaining feature shapes 310. In an exemplary embodiment, the place remaining features step 430 places the remaining feature shapes 310 one at a time by identifying the feature position corresponding to the largest hole between the features shapes 310 that have already been placed. This is done by computing the distance to the nearest feature position for each of the open candidate feature positions. Note that for candidate feature positions near an edge of the repeating tile pattern 365, it is necessary to account for wrap-around effects because the nearest feature position may be on the opposite side of the repeating tile pattern 365 when they are tiled together. The candidate feature position with the largest distance to the nearest previously-placed feature position is selected to place the next feature shape 310. This is repeated until number of remaining feature shapes 415 have been placed. Note that any portions of the placed feature shapes 310 that overlap an edge of the repeating tile pattern 365 are wrapped around to the opposite edge.

After all of the feature shapes 310 have been placed, a pattern acceptable test 435 is used to determine whether the resulting repeating tile pattern 365 is acceptable. In some embodiments, the pattern acceptable test 435 works in a similar fashion to the spacing OK test 425 to verify that a minimum distance between the placed random shape positions is greater than a predefined threshold distance. The threshold distance in this case may or may not be the same as that used for the spacing OK test 425. In other embodiments, the pattern acceptable test 435 uses a visual evaluation by a human observer to verify that no objectionable patterns (e.g., visible clumps of feature shapes 310) can be detected in the repeating tile pattern 365. If the pattern acceptable test 435 determines that the repeating tile pattern 365 is not acceptable, then the process is restarted by returning to the place random feature shapes step 420.

Figure 15:
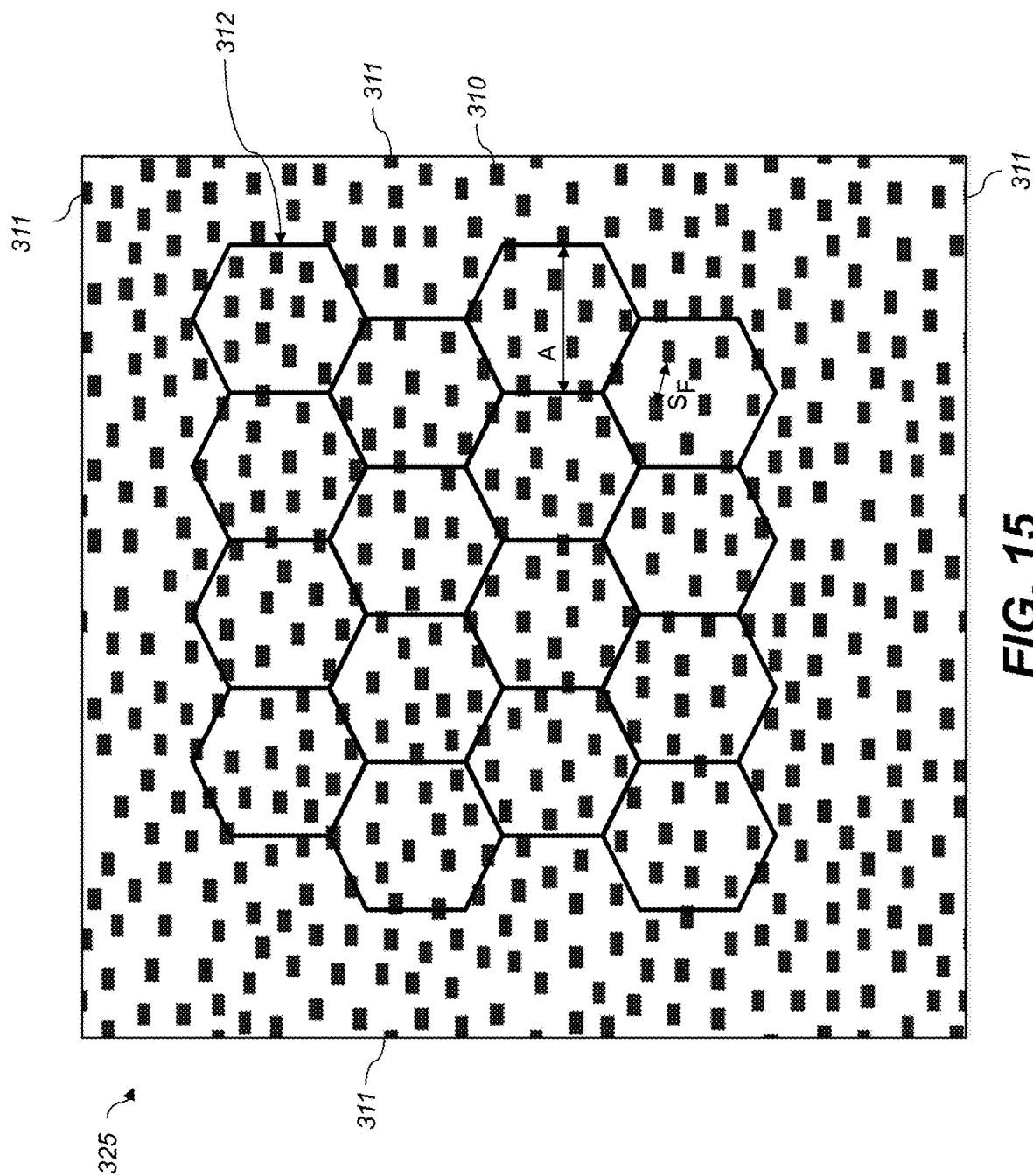
FIG. 15 illustrates an exemplary repeating tile determined using the method of FIG. 10.

FIG. 15 shows an exemplary repeating tile 325 determined in accordance with the present invention using the methods of FIGS. 10 and 13. In this example, the repeating tile 325 has a size of 200×200 pixels and is formed using 3×5 pixel feature shapes 310 (i.e., feature shape 310d in FIG. 11). The number of feature shapes 355 is set to N=473, yielding a pattern with a surface depth of 4.98 microns. It can be seen that some feature shapes 310 extend off the edge of the repeating tile 325 and wrap around to the opposite edge forming split feature shapes 311. (Note that when the repeating tile 325 is positioned in a tiled arrangement, the split feature shapes 311 will match up with those in the adjacent repeating tile 325 to form a complete feature shape 310.) It can be seen that the feature shapes 310 are arranged in pseudo-random feature locations having "blue-noise" characteristics. A pattern of anilox cells 312 corresponding to a 6.45 BCMI anilox with 356 lpi with a cell width of 71 microns are overlaid to illustrate a typical relationship between the anilox roller surface and the pattern of raised features on the flexographic printing plate 345 (FIG. 7). Because of the irregular spacings between the positions of the feature shapes 310, it can be seen that any periodic interactions between the pattern of anilox cells and the pattern of raised features are avoided. Furthermore, it can be seen that the scale of the pattern of feature shapes 310 (and therefore the corresponding pattern of raised features) is such that the anilox cell size A is larger than an average spacing $S_F$ between the raised features, and more preferably is more than two times the average spacing $S_F$ between the raised feature, such that a plurality of the raised features receive ink from a single anilox cell. Typically, the size of the repeating tile 325 when overlaid on the pattern of anilox cells 312 should be such that it is at least 2× the anilox cell size A, and more preferably is at least 4× the anilox cell size A.

Returning to a discussion of FIG. 7, once the plate formation pattern 335 has been determined, a flexographic printing plate formation process 340 is used to form a corresponding flexographic printing plate 345. The flexographic printing plate formation process 340 should generally correspond to that which was modeled by the plate formation model 395 in FIG. 10. In an exemplary embodiment, the flexographic printing plate formation process 340 is that which was described earlier relative to the discussion of the plate formation model 395. In other embodiments, any other method for forming flexographic printing plates known in the art can be used in accordance with the present invention.

For example, in other embodiments a direct-writing process can be used where the flexographic printing plate formation process 340 uses a laser ablation process to directly form flexographic printing plate 345 in accordance with the plate formation pattern 335 wherein a laser is used to remove material from the flexographic printing plate, leaving behind the relief image. The resulting flexographic printing plate can be subsequently cured thermally.

Figure 16:
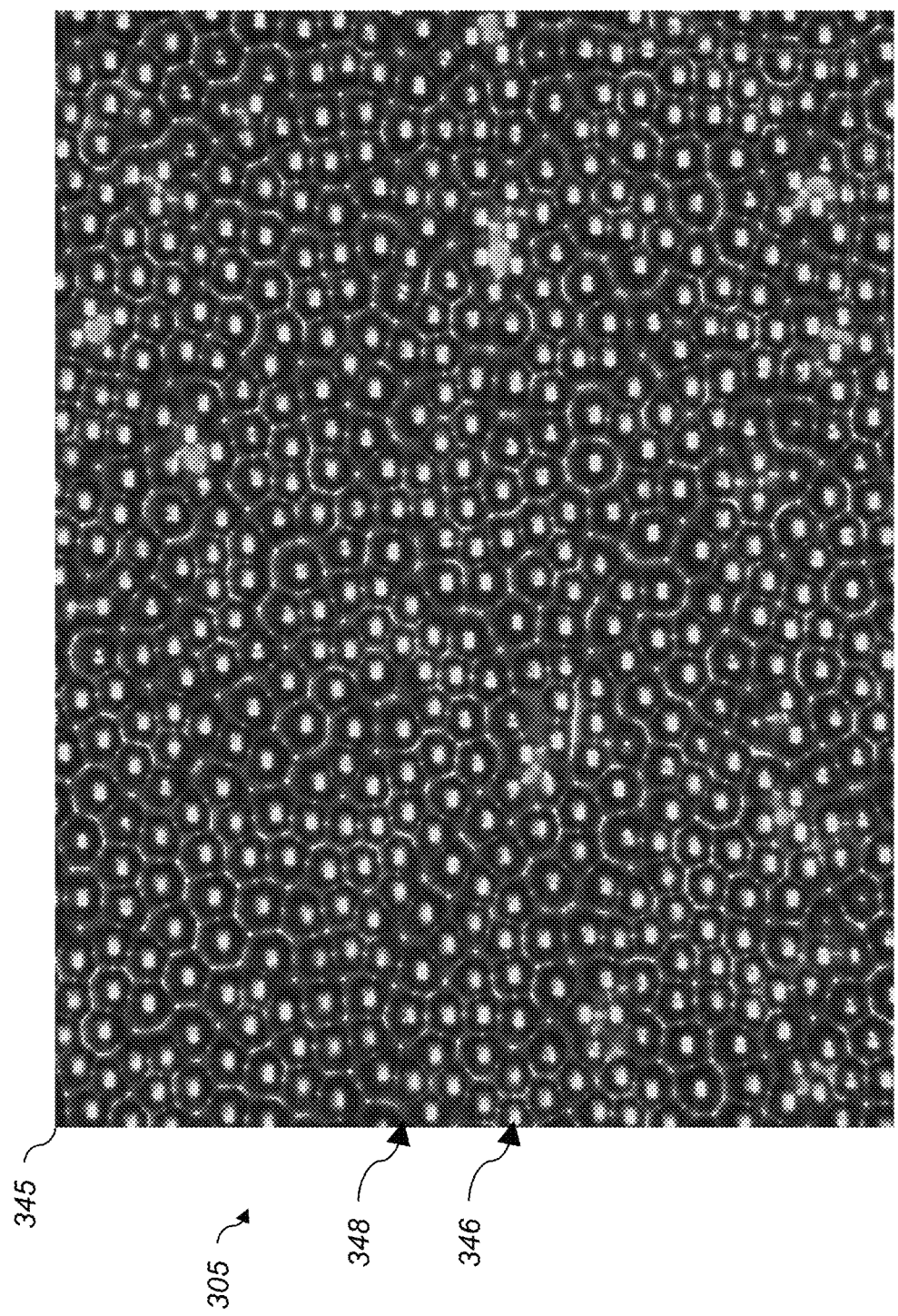
FIG. 16 illustrates an exemplary flexographic printing plate formed using the method of FIG. 7.

In accordance with the present invention, regions of the resulting flexographic printing plate 345 corresponding to the uniform image regions 305 (FIG. 8) of the functional device pattern 300 will include a pattern of raised features 346 in positions corresponding to the feature positions in the repeating tile 325. An example of a flexographic printing plate 345 formed in accordance with the method of the present invention is shown in FIG. 16, where the pattern of FIG. 15 was employed. FIG. 16 is a reflection photomicrograph of the flexographic printing plate 345 in a region corresponding to one of the uniform image regions 305 of the functional device pattern 300 (FIG. 8), with the focus adjusted to show the tops of the raised features 346 together with the valleys 348 that form the cells in the flexographic printing plate 345 around and between the raised features 346.

In preferred embodiments of the invention, the scale of the pattern of raised features 346 in the uniform image regions 305 on the flexographic printing plate 345 is such that the average distance between the raised features 346 is substantially less than the size of the cells on the anilox roller 115 (FIG. 1). In an exemplary configuration, the average distance between raised features 346 is between 10-30% of the anilox roller cell size. In other configurations, the average distance between raised features can be between 5-50% of the anilox roller cell size.

In accordance with the present invention, a plurality of the raised features 346 in the uniform image regions 305 of the flexographic printing plate 345 will receive ink from a single anilox cell 312 (FIG. 15) of the anilox roller 115 (FIG. 1). This is different than conventional flexographic printing of halftone images wherein a plurality of anilox cells 312 will typically provide ink to a single raised feature (e.g., a halftone dot). In conventional flexographic printing, the raised feature sizes and the anilox cell sizes are generally selected such that the raised features are at least slightly larger than the anilox cells to avoid the phenomenon of dot-dipping. Dot-dipping results in over-inked, smeared dots with larger than intended printed diameters because dots smaller than the size of anilox cell can be forced into the cell under impression and more ink is drawn out with the dot than desired. In accordance with the invention, dot-dipping is actually desirable to enable filling of the cells formed between the raised features in the flexographic printing plate. Thus, it can be seen that conventional flexographic printing arrangements would teach away from the configurations of the present invention wherein a plurality of the raised feature shapes receive ink from a single anilox cell of the anilox roller.

In an exemplary embodiment, the flexographic printing plate 345 is used in a flexographic printing process such as the flexographic printing system 100 (FIG. 1) to form a printed image. In the flexographic printing process ink is transferred from an anilox roller 115 (FIG. 1) to the flexographic printing plate 345, and from there to the substrate 150 to provide a printed pattern corresponding to the functional device pattern 300.

In some configurations, the flexographic printing plate 345 can be used to print a conductive ink to form conductive elements of a functional device such as a touch sensor or an antenna. In other configurations, the flexographic printing plate 345 can be used to print a catalytic ink, and an electroless plating process such as that described relative to FIG. 2 can be used to plate a conductive material onto the catalytic ink of the printed pattern to provide conductive elements of a functional device. The flexographic printing plate 345 can also be used to print other types of "inks" including insulating materials and semiconductor materials to produce corresponding layers of the functional device.

Figure 17:
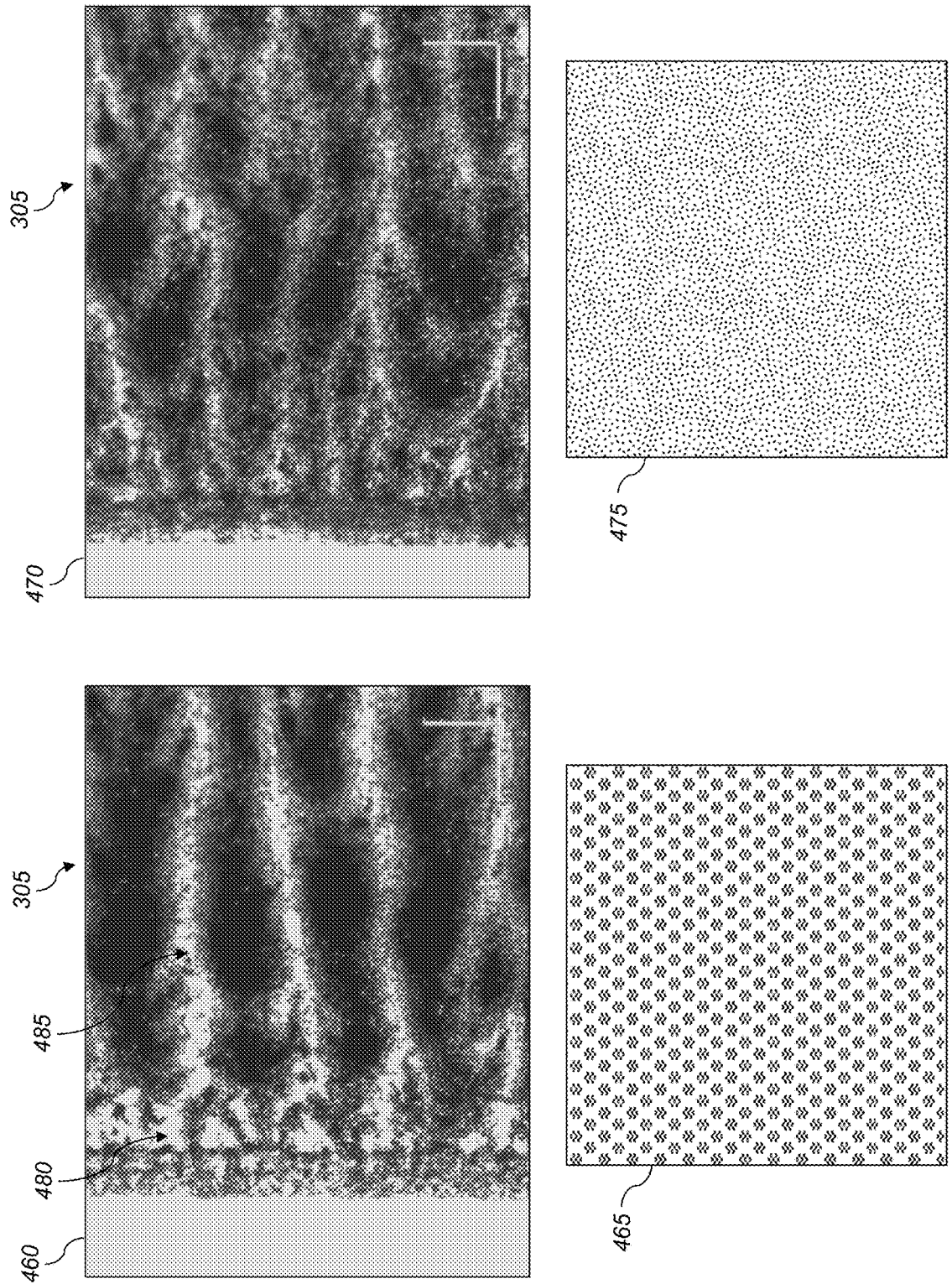
FIG. 17 illustrates the reduction in printing artifacts achieved using the method of the present invention.

FIG. 17 shows a comparison of photomicrographs 460, 470 of uniform image regions 305 printed on a flexographic printing system 100 using an anilox roller 115 (FIG. 1) with 8.0 BCMI cells in a 60 degree 240 lpi hexagonal cell pattern. Photomicrograph 460 shows a comparative printed image where a conventional DigiCap NX periodic pattern of raised features is provided in the uniform image regions 305. The periodic pattern of raised features is formed using the periodic plate formation pattern 465 which includes 30 μm wide features with 30 μm spacings, resulting in a printing plate with an average depth of 8.54 μm. Photomicrograph 470 shows a printed image made using the method of the present invention with feature shapes 310b (FIG. 11) arranged in pseudo-random feature positions to provide the plate formation pattern 475. The resulting printing plate has an average depth of 10.0 μm. Photomicrograph 470 shows that the printed image made using the flexographic printing plate of the invention has substantially fewer trail-edge void artifacts 480 and a lower level of non-uniformity artifacts 485 than the photomicrograph 460 associated with the conventional printing plate (where the trail-edge corresponds to the left side of the uniform image regions 305). Note that the illustrated plate formation patterns 465, 475 are approximately one square millimeter and are not to scale with the photomicrographs 460, 470.

The flexographic printing plates used to form the printed images in the photomicrographs 460, 470 were also tested using other types of anilox rollers. When printed with a 5.0 BCMI anilox roller 115 with a 60 degree 400 lpi hexagonal cell pattern, the print formed using plate formation pattern 465 showed a regular non-uniform striped pattern that was perpendicular to the web direction whereas the plate formation pattern 475 of the invention resulted in a more uniform printed image. When printed with a 10.0 BCMI anilox roller 115 with a 60 degree 180 lpi hexagonal cell pattern, the print formed using the plate formation pattern 465 showed a regular non-uniform striped pattern that was parallel with the web direction whereas the plate formation pattern 475 of the invention resulted in a more uniform printed image.

Figure 18:
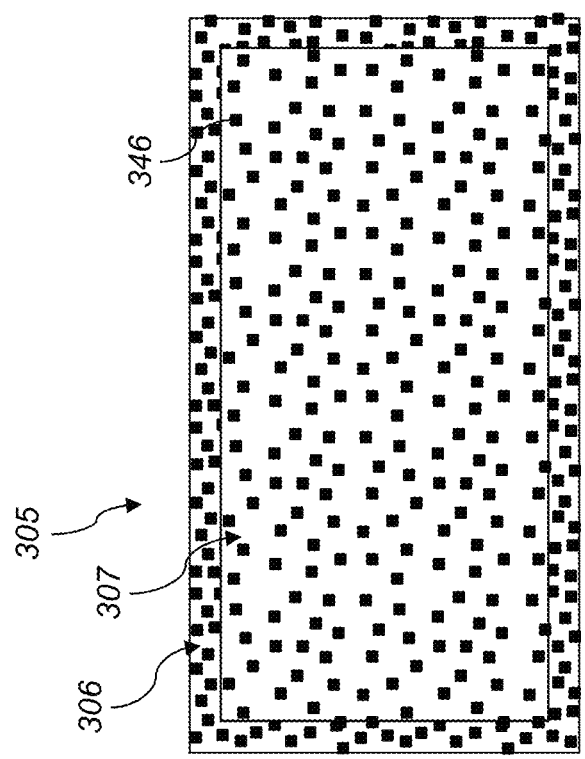
FIG. 18 shows an exemplary uniform image region where different patterns of raised features are formed in a border region and an interior region.

In some embodiments, a plurality of different repeating tiles 325 (FIG. 7) are determined having different characteristics. For example, they can include different numbers of feature shapes 355 to provide different average depths 320 or they can be formed using different feature shapes 310. In some embodiments, one of the repeating tiles 325 can be a solid tile which will have the effect of not modifying the functional device pattern 300 to produce a pattern of raised features 346. The different repeating tiles 325 can be used for different types of image content or for different portions of the uniform image regions 305. For example, the uniform image regions 305 can be analyzed to identify border regions 306 and interior regions 307 as illustrated in FIG. 18. A first repeating tile 325 can be applied to the interior regions 306 to provide a first pattern of raised features 346. A second repeating tile 325 can be applied to the border regions 307 to provide a different pattern. In the illustrated configuration, a denser pattern of raised features 346 is applied in the border region 307 than in the interior region 307. In some cases, a less dense pattern may be preferred. In other configurations, a repeating tile can be applied in the border region 306 that provides a solid border pattern. In some configurations, a gap region can be provided between the first pattern of raised features 346 in the border region 306 and the second pattern of raised features 346 in the interior region 307 similar to the gap region described in commonly-assigned U.S. Pat. No. 10,150,319, which is incorporated herein by reference.

Figure 19:
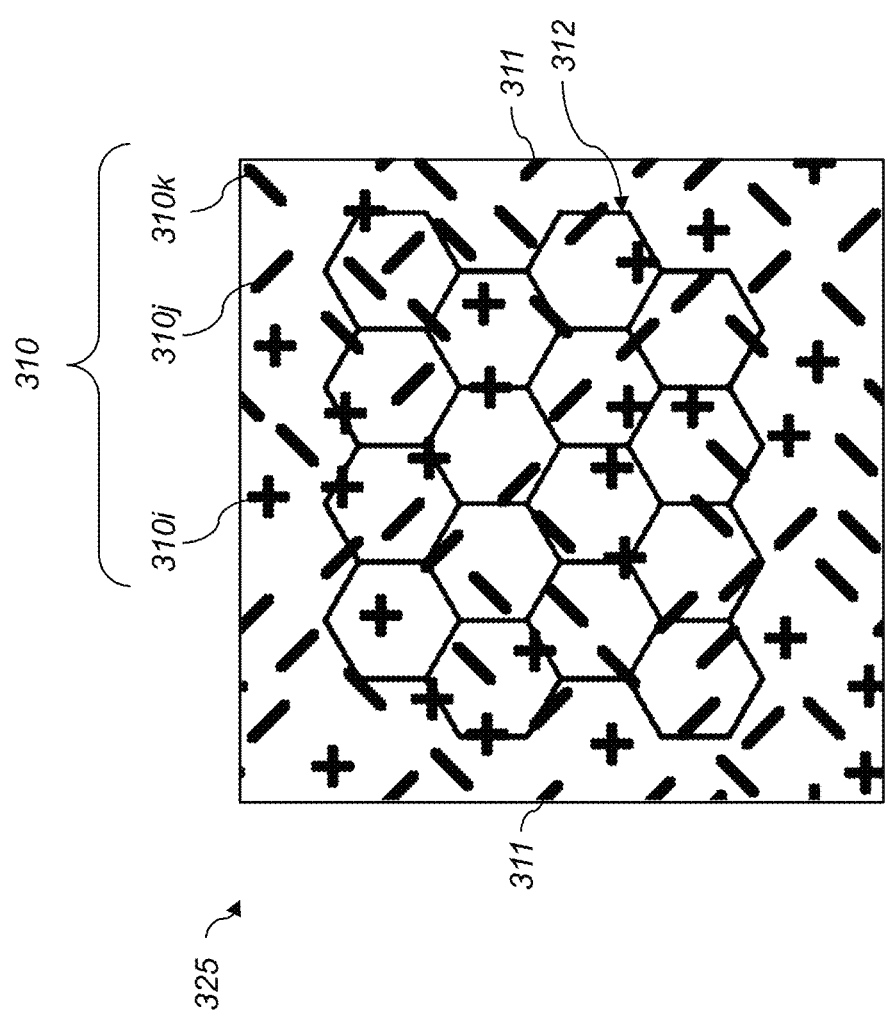
FIG. 19 illustrates a repeating tile including a plurality of different feature shapes.

In the repeating tiles 325 formed using the method of FIG. 10, the same feature shape 310 is placed at each of the feature locations. In other embodiments, the repeating tiles 325 can include a plurality of different feature shapes 310. For example, a set of feature shapes can be provided including two or more different feature shapes 310. The form repeating tile step 360 of FIG. 10 can then be modified so that the feature shape 310 placed at each of the feature locations is selected from the set of feature shapes 310. The feature shape 310 to be placed at each feature location can be selected using various strategies. For example, they can be selected randomly from the set of feature shapes 310, or they can be selected according to a predefined sequence. FIG. 19 shows an example of a repeating tile 325 which is formed using a set of three different feature shapes 310. In this example, the set of feature shapes 310 includes feature shapes 310$i$ (a 5×5 plus sign), 310$j$ (a 5 pixel wide downward slanting diagonal line) and 310$k$ (a 5 pixel wide upward slanting diagonal line). In this example, each feature shape 310 placed by the place random features step 420 and the place remaining feature step 430 in FIG. 10 is selected by cycling through a predefined sequence of the feature shapes 310$i$, 310$j$, 310$k$. As with FIG. 15, the repeating tile 325 includes split feature shapes 311 that extend across a boundary of the repeating tile 325. A pattern of anilox cells 312 is overlaid to illustrate the relative scale of the feature shapes 310 and the anilox cells 312.

Figure 20:
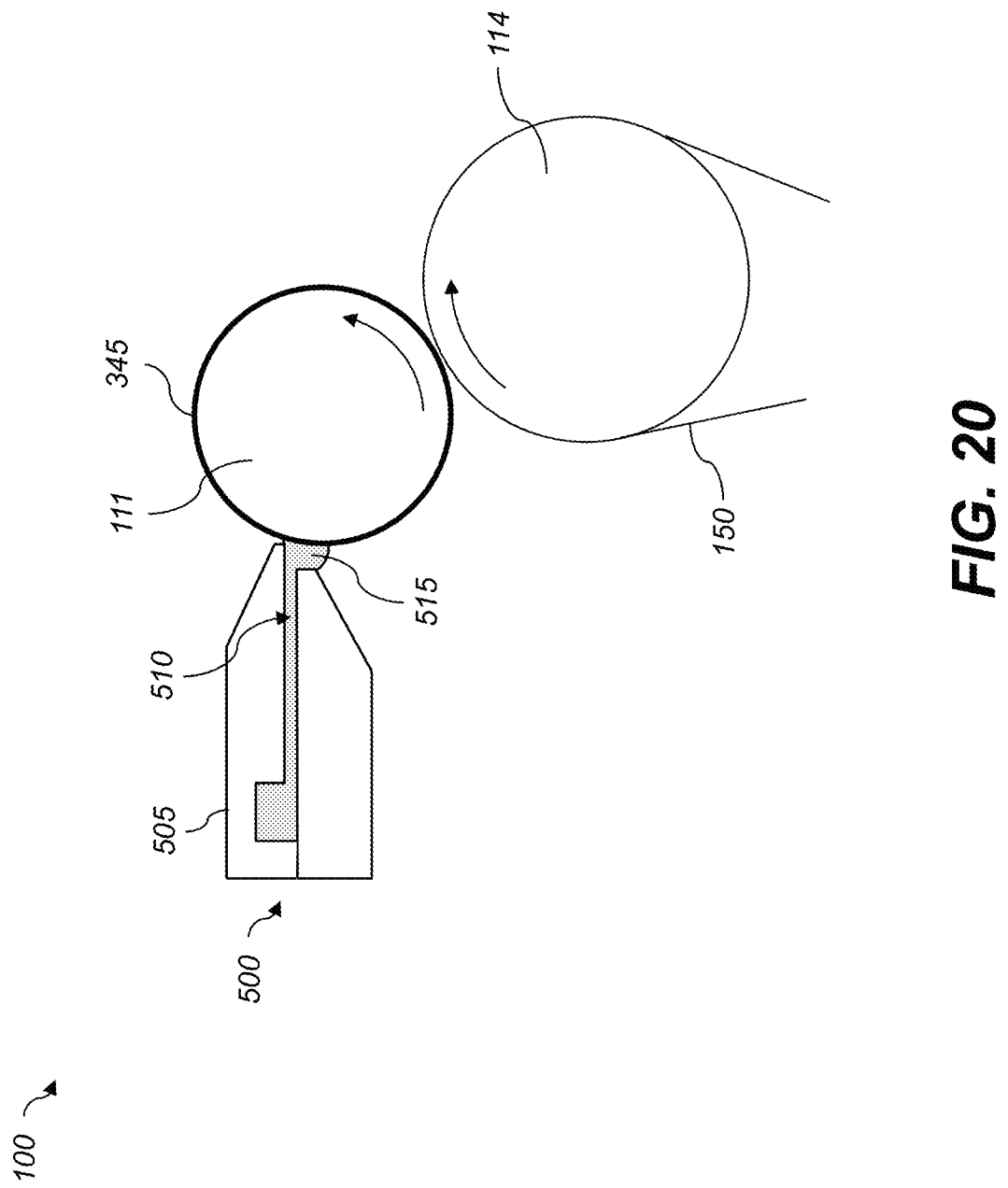
FIG. 20 illustrates a flexographic printing system using a slot-die inking system.

The flexographic printing system 100 of FIG. 1 uses an anilox rollers 115, 125, 135, 145 to transfer ink to flexographic printing plates 112, 122, 132, 142, which can be the flexographic printing plates 345 (FIG. 7) of the present invention. It will be recognized that other types of flexographic printing systems can also be used in accordance with the present invention. For example, in other embodiments, other types of inking systems can be used to transfer ink to the flexographic printing plates 345. For example, FIG. 20 illustrates a printing station of flexographic printing system 100 similar to that shown in FIG. 1 where the inking system using an anilox roller 115 has been replaced by a slot-die inking system 500. The slot-die inking system 500 includes a slot die 505 having a slot 510 through which printing ink 515 is delivered to the surface of the flexographic printing plate 345 of the present invention, which is mounted on plate cylinder 111. This configuration can be advantageous when using materials that might otherwise plug anilox cells causing ink thickness variability and associated defects. It can also offer the ability to avoid interactions between the anilox cell pattern and the flexographic printing plate pattern, enabling greater freedom in the choice of raised features to be used for printing defect free images. The amount of ink delivered to the flexographic printing plate 345 is a function of the geometry of the slot die 505, the distance of the exit of the slot die 505 to the flexographic printing plate 345, the fluid flow rate through the slot die 505, the viscosity of the fluid, and the rotation speed of the plate cylinder 111.

In some embodiments, the flexographic printing system 100 (FIG. 1) uses a catalytic ink to provide printed features including a pattern of active print features that are used to form conductive elements for a functional device upon treating with an electroless plating system 200 (FIG. 2). In other embodiments, the flexographic printing system 100 can be used to print a conductive ink, thereby directly forming the conductive elements without the need for a subsequent electroless plating process. In this case, the use of flexographic printing plates including the patterns of raised features in the uniform image regions still provides the same advantage of artifact reduction. Examples of conductive inks that can be used in such embodiments would include inks containing high concentrations of silver nanoparticles, typically greater than 50 weight percent in the dried state, more preferably greater than 60 weight percent in the dried state.

Exemplary inks that can be used in accordance with the present invention are described in the aforementioned U.S. Pat. No. 9,315,062. Appropriate inks can include printable materials that are dissolved or suspended in suitable carrier solvents as described above and that are known in the art for this purpose. For example, a silver-containing electrically conductive printable material composition can include any useful amount of silver metal particles that are dispersed in aqueous or non-aqueous carrier solvents.

The method of the present invention can be used in many ways to form a printed pattern on a suitable substrate for use in devices and for components in a variety of applications including, but not limited to, electronic, optical, sensory, and diagnostic devices. Such electronic and optical devices and components include but are not limited to, radio frequency tags (RFID), sensors, and memory and back panel displays. The method of this invention can be used to form patterns of electrically conductive materials, semi-conductive materials, dielectric materials, and colorants (dyes or pigments). The patterns can be designed to be temperature-sensitive or pressure-sensitive as well.

The present invention is useful for providing electrically conductive patterns that are designed for use as touch panel displays. Such electrically conductive patterns can be provided using print materials, such as electrically conductive metals and metallic salts that are electrically conductive, or can be processed or treated in some manner to become electrically conductive. Useful print materials of this type include but are not limited to, silver and silver salts such as silver halides, and silver behenate and other organic silver salts. Such electrically conductive metal patterns can be further processed for example using electroless metal plating.

Some particularly useful print materials include but are not limited to, electrically conductive inks containing electrically conductive particles such as metal flakes or particle or nano-wires. Electrically conductive inks include electrically conductive silver-containing inks, gold-containing inks, copper-containing inks, carbon-containing inks, palladium-containing inks, and inks containing catalytic "seed" materials for electroplating or electroless plating. Some of such inks can be obtained commercially from sources such as InkTec (California), Flint Ink Corporation (Michigan), and Methode Development Company (Chicago). Some of these "inks" can be used as a carrier liquid while other inks comprise both a carrier liquid and a print material. It is also possible to use print materials that contain UV-curable components.

Print materials include for example, electrically conductive materials, semi-conductive materials, and dielectric materials. Examples of electrically conductive materials include but are not limited to, conductive polymers, nanoparticles of indium-tin oxide, metals such as gold, silver and silver precursors, copper, and palladium, metal complexes, metal alloys, and combinations thereof. A print material can alternatively be a conductive material precursor such as a metal salt (for example a silver salt like a silver halide or an organic silver salt), or an electroless metallization catalyst such as palladium particles. Examples of useful electrically semi-conductive inorganic materials include but are not limited to silicon, germanium, gallium arsenide, zinc oxide, and zinc selenide, and combinations thereof.

Print materials can be of any form including particulate, polymeric materials, small molecule materials, and other forms that would be apparent to a skilled worker. For example, useful electrically semi-conductive materials and dielectric materials can be used as particulate print materials. Useful particulate or film-forming polymeric print materials include electrically conductive polymers including but not limited to, homopolymers and copolymers comprising polythiophenes, polyanilines, polypyrroles, polycarbazoles, polyindoles, polyazepines, polyethylenedioxythiophenes, poly(3-alkylthiophenes), poly(p-phenylene vinylene)'s, polyp-phenylene)'s, poly(styrene sulfonic acid) (PSS), poly (p-phenylene sulfide), polyacetylene, poly(3,4-ethylene dioxythiophene) (PEDOT), and a mixture of poly(styrene sulfonic acid) and poly(3,4-ethylene dioxythiophene) (PSS: PEDOT).

It is also possible that the print materials are nanoparticles of electrically conductive, electrically semi-conductive, and dielectric materials. Nanoparticles are microscopic particles whose size is measured in nanometers (nm). Nanoparticles include particles having at least one dimension less than 200 nm and in some embodiments, the nanoparticles have an average diameter of at least 3 nm to and including 100 nm. The nanoparticles can be in the form of clusters. The shape of the nanoparticles is not limited and includes nanospheres, nanorods, and nanocups. Nanoparticles composed of electrically semi-conductive materials can also be known as quantum dots if the particles are small enough (usually less than 30 nm) that quantization of electronic energy levels occurs. Electrically conductive semi-conductive materials include light-emitting quantum dots. The print materials include but are not limited to, semi-solid nanoparticles such as liposomes, soft nanoparticles, nanocrystals, and hybrid structures, such as core-shell nanoparticles. Moreover, the print materials also include nanoparticles of carbon such as carbon black, carbon nanotubes, electrically conducting carbon nanotubes, graphene, carbon black conducting polymers, and electrically semi-conducting nanotubes. Metal nanoparticles and dispersions of gold, silver, and copper are also useful with this invention.

In many exemplary embodiments, the printable material composition used in this invention includes a print material that is selected from the group consisting of electrically conductive materials, semi-conductive materials, dielectric materials, small molecule materials, polymeric materials, bio-based materials, electro luminescence materials, and combinations thereof.

In some embodiments, the printable material composition used in this invention includes a print material that contains nanoparticles of an electrically conductive material selected from the group consisting of silver or silver precursor, gold, copper, palladium, indium-tin oxide, or combinations thereof. For example, in some very useful embodiments, the printable material composition includes a print material that contains nanoparticles of an inorganic or organic silver salt such as a silver halide, silver behenate, and other silver salts that would be readily apparent to one skilled in the art.

In general, one or more print materials can be dispersed, dissolved, or suspended in a suitable carrier liquid, forming a printable material composition for application to a substrate using the flexographic printing plate described herein. The carrier liquid used for the printable material composition is not limited and can include organic compounds and aqueous compounds. For example, the carrier liquid can be an organic compound that is an alcohol-based compound. The carrier liquid can be a solvent that is capable of dissolving another substance such as one or more print materials to form a uniform solution, or it can be a compound capable of dispersing or suspending the print material in solution sufficient to carry out the method of this invention.

The carrier liquid can also include one or more compounds as a solvent for the print material. For example, the carrier liquid can include one or more solvents for the print material. In other embodiments, the carrier liquid comprises two or more solvents, for example a co-solvent mixture, for the print material. The solvent mixtures can be chosen using various criteria such as the evaporation rate (volatility) of the individual solvents, and the solvating power of the individual solvent components for a particular print material. Further details of such solvents are provided in U.S. Patent Application Publication 2008/0233280, which is incorporated herein by reference.

Representative useful carrier liquid solvents include but are not limited to, alcohols (such as isopropyl alcohol, 2-ethyl hexanol, and α-terpenol), acetates (such as ethyl acetate), water, hydrocarbons (such as toluene and cyclohexane), and combinations of miscible solvents.

In general, the printable material composition or "ink" comprising the carrier liquid and print material has a viscosity of at least 10 cps and up to and including 1500 cps, or typically of at least 200 cps and up to and including 900 cps, or up to and including 1000 cps. Some highly viscous printable material compositions can be used in the practice of this invention, and have a viscosity of at least 1500 cps up to and including 5000 cps. Viscosity can be measured using a conventional means and equipment such as a Brookfield Viscometer DV-II+ Pro (available from Brookfield Engineering Laboratories).

In some cases, it may be necessary to treat the ink with a post-processing operation, such as sintering at an elevated temperature or exposure to hydrochloric acid fumes, in order to improve (or achieve) conductivity. In other embodiments, exposure to high intensity light may be used to convert a non-conductive printed ink pattern into a conductive pattern.

As mentioned earlier, the flexographic printing system 100 (FIG. 1) can also be used to print other types of active print features including semiconductor features or insulator features. Such features can perform electrical functions that will be well-known to those skilled in the art. Examples of ink that can provide semiconductor properties would include inks with semiconducting polymers such as those available from BASF. Examples of ink that can provide insulator features would include a UV curable ink such as the protective coating solutions described in U.S. Patent Application Publication 2014/0327452.

Exemplary substrates 150 that can be used in accordance with the invention are described in the aforementioned U.S. Pat. No. 9,315,062. Suitable substrates include but are not limited to, metallic films or foils, metallic films on polymer, glass, or ceramic supports, metallic films on electrically conductive film supports, semi-conducting organic or inorganic films, organic or inorganic dielectric films, or laminates of two or more layers of such materials. For example, useful substrates can include indium-tin oxide coated glass, indium-tin oxide coated polymeric films, poly(ethylene terephthalate) films, poly(ethylene naphthalate) films, polyimide films, polycarbonate films, polyacrylate films, polystyrene films, polyolefin films, polyamide films, silicon, metal foils, cellulosic papers or resin-coated or glass-coated papers, glass or glass-containing composites, ceramics, metals such as aluminum, tin, and copper, and metalized films. The substrate can also include one or more charge injection layers, charge transporting layers, and semi-conducting layers on which the printable material composition pattern is formed.

Particularly useful substrates are polyesters films such as poly(ethylene terephthalate), polycarbonate, or poly(vinylidene chloride) films that have been surface-treated, or coated with one or more suitable adhesive or subbing layers, the outer layer being receptive to the ink. Useful outer layers can be a vinylidene chloride polymer containing layer or a glycidyl methacrylate-butylacrylate co-polymer.

Useful substrates can have a desired thickness depending upon the eventual use of the printed electrical device, for example its incorporation into various articles or devices (for example optical devices or optical panels). The thickness of the substrate can be 4 microns to 250 microns, preferably 25 to 125 microns, and more preferably 38 to 75 microns.

The substrate can be opaque, translucent, or transparent. For applications requiring transparency, substrates can have a light transmission of 70% or greater, preferably 75% or greater, and more preferably 80% or greater.

The invention has been described in detail with particular reference to certain preferred embodiments thereof, but it will be understood that variations and modifications can be effected within the spirit and scope of the invention.

PARTS LIST 100 flexographic printing system
102 supply roll
104 take-up roll
105 roll-to-roll direction
106 roller
107 roller
110 print module
111 plate cylinder
112 flexographic printing plate
113 raised features
114 impression cylinder
115 anilox roller
116 UV curing station
120 print module
121 plate cylinder
122 flexographic printing plate
124 impression cylinder
125 anilox roller
126 UV curing station
130 print module
131 plate cylinder
132 flexographic printing plate
134 impression cylinder
135 anilox roller
136 UV curing station
140 print module
141 plate cylinder
142 flexographic printing plate
144 impression cylinder
145 anilox roller
146 UV curing station
150 substrate
151 first side
152 second side
200 roll-to-roll electroless plating system
202 supply roll
204 take-up roll
205 in-track direction
206 drive roller
207 drive roller
208 web-guiding roller
210 plating solution
215 replenished plating solution
220 reservoir
230 tank
232 drainpipe
234 return pipe
236 filter
240 pump
242 controller
250 web of media
251 first surface
252 second surface
300 functional device pattern
305 uniform image region
306 border region
307 interior region
310 feature shape
310a feature shape
310b feature shape
310c feature shape
310d feature shape
310e feature shape
310f feature shape
310g feature shape
310h feature shape
311 split feature shape
312 anilox cell
315 determine repeating tile step
320 average depth
325 repeating tile
330 determine plate formation pattern step
335 plate formation pattern
340 flexographic printing plate formation process
345 flexographic printing plate
346 raised feature
347 shoulder
348 valley
349 mask image
350 initialize number feature shapes step
355 number of feature shapes step
360 form repeating tile pattern step
365 repeating tile pattern
370 estimate average depth step
375 estimated average depth
380 done test
385 modify number of feature shapes step
390 save repeating tile step
395 plate formation model
400 determine number of random feature shapes step
405 random fraction
410 number of random feature shapes
415 number of remaining feature shapes
420 place random feature shapes step
425 spacing ok test
430 place remaining feature shapes step
435 pattern acceptable test 450 graph
460 photomicrograph
465 plate formation pattern
470 photomicrograph
475 plate formation pattern
480 trail-edge void artifact
485 non-uniformity artifact
500 slot-die inking system
505 slot die
510 slot
515 ink
500 slot-die inking system
600 apparatus
610 touch screen
620 display device
630 touch sensor
640 transparent substrate
641 first side
642 second side
650 conductive pattern
651 fine lines
652 grid
653 fine lines
654 channel pads
655 grid column
656 interconnect lines
658 connector pads
660 conductive pattern
661 fine lines
662 grid
663 fine lines
664 channel pads
665 grid row
666 interconnect lines
668 connector pads
680 controller

The invention claimed is:

1. A method for fabricating a flexographic printing plate for printing image patterns, comprising:
receiving an image pattern including one or more uniform image regions;
determining a repeating tile for forming a pattern of raised features in regions of the flexographic printing plate corresponding to the one or more uniform image regions of the image pattern, including
defining a tile size for the repeating tile having an area of at least 100 square pixels;
defining a feature shape; and
defining the repeating tile including a plurality of the feature shapes, wherein the feature shapes are positioned in a pattern of pseudo-random feature locations within the repeating tile, and wherein the feature shapes cover between 2-30% of the area of the repeating tile;
determining a plate formation pattern corresponding to the image pattern, wherein the repeating tile is applied in a tiled arrangement to the one or more uniform image regions within the image pattern; and
using the determined plate formation pattern to form the flexographic printing plate using a flexographic printing plate formation process, wherein the plate formation pattern is transferred to the flexographic printing plate such that regions of the flexographic printing plate corresponding to the one or more uniform image regions of the image pattern include a pattern of raised features in positions corresponding to the feature locations in the repeating tile;
wherein the one or more uniform image regions within the image pattern are identified by automatically analyzing the image pattern to detect elements of the image pattern and determine associated element dimensions, and where any element having a minimum element dimension that exceeds a predefined threshold dimension is designated to be a uniform image region.

2. The method of claim 1, wherein the feature shape has an area of at between 2-100 square pixels.

3. The method of claim 1, wherein a number of feature shapes within the repeating tile is selected to provide a specified average depth for the pattern of raised features in the one or more uniform image regions of the flexographic printing plate.

4. The method of claim 3, wherein the number of feature shapes within the repeating tile is selected by a process that includes:
a) initializing the number of features shapes to an initial value;
b) determining a repeating tile pattern having the number of feature shapes;
c) using a model of the flexographic printing plate formation process to determine an estimated average depth of the pattern of raised features that would be formed using the repeating tile pattern;
d) modifying the number of feature shapes if the estimated average depth of the printing plate differs from the specified average depth for the pattern of raised features by more than a predefined threshold;
e) repeating steps b)-d) until the estimated average depth of the printing plate differs from the specified average depth for the pattern of raised features by less than the predefined threshold.

5. The method of claim 3, wherein the specified average depth for the pattern of raised features in the one or more uniform image regions of the flexographic printing plate is in the range of 1-20 μm.

6. The method of claim 1, wherein the pattern of pseudo-random feature positions within the repeating tile is a blue-noise pattern.

7. The method of claim 6, wherein the blue-noise pattern is determined using a blue-noise dither halftoning algorithm or an error diffusion halftoning algorithm.

8. The method of claim 6, wherein the blue-noise pattern is determined by a method that includes:
placing a first fraction of the feature shapes at randomly selected feature locations; and
sequentially placing a remaining fraction of the feature shapes at feature locations determined to be farthest from the feature locations of the previously placed feature shapes.

9. The method of claim 8, wherein the feature locations are selected such that a distance between the feature locations is greater than a predefined threshold distance.

10. The method of claim 1, further including using the flexographic printing plate in a flexographic printing process to transfer ink to a substrate.

11. The method of claim 10, wherein the ink is transferred from an ink supply to the flexographic printing plate using an anilox roller.

12. The method of claim 11, wherein a surface of the anilox roller includes a plurality of anilox cells having an anilox cell size, and wherein the anilox cell size is larger than an average spacing between the raised features on the flexographic printing plate in the one or more uniform image regions.

13. The method of claim 12, wherein the anilox cell size is larger than twice the average spacing between the raised features on the flexographic printing plate in the one or more uniform image regions.

14. The method of claim 10, wherein the ink is transferred from an ink supply to the flexographic printing plate using a slot-die.

15. The method of claim 1, wherein the feature shapes have associated feature sizes, and wherein the feature sizes are in the range of 2-20 μm.

16. The method of claim 15, wherein the feature sizes are in the range of 4-8 μm.

17. The method of claim 1, wherein the threshold dimension is at least two times an average spacing between the feature shapes in the repeating tile.

18. The method of claim 1, further including determining a border region for each of the one or more uniform image regions, and wherein the repeating tile is only applied to portions of the one or more uniform image regions that are inside of the border region.

19. The method of claim 18, wherein a different pattern of feature shapes is applied in the border region.

20. The method of claim 18, wherein a solid border is formed in the border region.

21. The method of claim 1, wherein the flexographic printing plate formation process includes:
   using an imaging system to expose a mask material in an image-wise fashion according to the plate formation pattern to form a mask including a representation of the image pattern;
   laminating the mask material to a photopolymer layer of a photosensitive printing plate;
   exposing the laminated photosensitive printing plate to radiation to form a latent image in the photopolymer layer;
   removing the mask material; and
   processing the exposed photosensitive printing plate to form the flexographic printing plate.

22. The method of claim 1, wherein the flexographic printing plate formation process includes using a laser ablation system to ablate the surface of a printing plate in an image-wise fashion according to the plate formation pattern to form the flexographic printing plate.

23. The method of claim 1, wherein the image pattern is a functional device pattern.

* * * * *